US011078591B2

(12) United States Patent
Brogan et al.

(10) Patent No.: US 11,078,591 B2
(45) Date of Patent: Aug. 3, 2021

(54) PROCESS FOR OPTIMIZING COBALT ELECTROFILL USING SACRIFICIAL OXIDANTS

(71) Applicant: Lam Research Corporation, Fremont, CA (US)

(72) Inventors: Lee J. Brogan, Newberg, OR (US); Natalia V. Doubina, Portland, OR (US); Matthew A. Rigsby, Tualatin, OR (US); Jonathan David Reid, Sherwood, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 263 days.

(21) Appl. No.: 16/410,420

(22) Filed: May 13, 2019

(65) Prior Publication Data

US 2019/0271094 A1    Sep. 5, 2019

Related U.S. Application Data

(62) Division of application No. 15/343,089, filed on Nov. 3, 2016, now Pat. No. 10,329,683.

(51) Int. Cl.
*C25D 7/12* (2006.01)
*C25D 5/04* (2006.01)
(Continued)

(52) U.S. Cl.
CPC ............. *C25D 7/123* (2013.01); *C25D 3/12* (2013.01); *C25D 5/04* (2013.01); *C25D 17/001* (2013.01);
(Continued)

(58) Field of Classification Search
None
See application file for complete search history.

(56) References Cited

U.S. PATENT DOCUMENTS 2,834,725 A    5/1958 Scheer et al.
4,595,462 A *  6/1986 Vangaever ............. C25D 21/12
                                                            204/412

(Continued)

FOREIGN PATENT DOCUMENTS

CN         1342220 A    3/2002
CN       102124551 A    7/2011
(Continued)

OTHER PUBLICATIONS

U.S. Office Action, dated Nov. 6, 2015, issued in U.S. Appl. No. 14/010,404.

(Continued)

*Primary Examiner* — Louis J Rufo
(74) *Attorney, Agent, or Firm* — Weaver Austin Villeneuve & Sampson LLP

(57) ABSTRACT

Embodiments herein relate to methods, apparatus, and systems for electroplating metal into recessed features using a superconformal fill mechanism that provides relatively faster plating within a feature and relatively slower plating in the field region. Moreover, within the feature, plating occurs faster toward the bottom of the feature compared to the top of the feature. The result is that the feature is filled with metal from the bottom upwards, resulting in a high quality fill without the formation of seams or voids, defects that are likely where a conformal fill mechanism is used. The superconformal fill mechanism relies on the presence of a sacrificial oxidant molecule that is used to develop a differential current efficiency within the feature compared to the field region. Various plating conditions are balanced against one another to ensure that the feature fills from the bottom upwards. No organic plating additives are necessary, though plating additives can be used to improve the process.

11 Claims, 9 Drawing Sheets

(51) Int. Cl.
*C25D 21/14* (2006.01)
*H01L 21/768* (2006.01)
*C25D 3/12* (2006.01)
*C25D 17/00* (2006.01)
*C25D 17/06* (2006.01)
*C25D 21/12* (2006.01)
*H01L 21/288* (2006.01)
*H01L 21/66* (2006.01)

(52) U.S. Cl.
CPC .............. *C25D 17/06* (2013.01); *C25D 21/12* (2013.01); *C25D 21/14* (2013.01); *H01L 21/2885* (2013.01); *H01L 21/76879* (2013.01); *H01L 22/12* (2013.01); *H01L 21/76898* (2013.01); *H01L 22/14* (2013.01)

(56) References Cited

U.S. PATENT DOCUMENTS

| | | |
|---|---|---|
| 5,314,725 A | 5/1994 | Morishita |
| 6,303,014 B1 | 10/2001 | Taylor et al. |
| 6,409,903 B1 | 6/2002 | Chung et al. |
| 7,776,741 B2 | 8/2010 | Reid et al. |
| 8,691,687 B2 | 4/2014 | Kelly et al. |
| 10,329,683 B2 | 6/2019 | Brogan et al. |
| 2002/0004301 A1 | 1/2002 | Chen et al. |
| 2003/0155247 A1 | 8/2003 | Miura et al. |
| 2004/0022940 A1 | 2/2004 | Nagai et al. |
| 2004/0072423 A1 | 4/2004 | Jorne et al. |
| 2005/0124154 A1 | 6/2005 | Park et al. |
| 2005/0130423 A1 | 6/2005 | Pyo |
| 2005/0205429 A1 | 9/2005 | Gebhart et al. |
| 2006/0079084 A1 | 4/2006 | Baskaran et al. |
| 2007/0062817 A1 | 3/2007 | Monchoix et al. |
| 2007/0062818 A1 | 3/2007 | Daviot et al. |
| 2007/0272560 A1 | 11/2007 | Gonzalez et al. |
| 2008/0236441 A1 | 10/2008 | Nobe |
| 2009/0188805 A1* | 7/2009 | Moffat .................. C25D 7/123 205/119 |
| 2010/0041226 A1 | 2/2010 | Reid et al. |
| 2011/0025338 A1 | 2/2011 | Willey et al. |
| 2011/0318479 A1 | 12/2011 | Reddington et al. |
| 2012/0097547 A1 | 4/2012 | Vereecken et al. |
| 2014/0183738 A1 | 7/2014 | Jezewski et al. |
| 2015/0053565 A1 | 2/2015 | Zhu et al. |
| 2018/0119305 A1 | 5/2018 | Brogan et al. |

FOREIGN PATENT DOCUMENTS

| | | |
|---|---|---|
| FR | 2 890 983 A1 | 3/2007 |
| JP | H11-097391 | 4/1999 |
| JP | 2002-527621 | 8/2002 |
| JP | 2009-509044 A | 3/2009 |
| WO | WO 00/22193 A2 | 4/2000 |
| WO | WO 01/11113 | 2/2001 |
| WO | WO 2011/154493 | 12/2011 |

OTHER PUBLICATIONS

U.S. Final Office Action, dated May 20, 2016, issued in U.S. Appl. No. 14/010,404.
U.S. Office Action, dated Apr. 26, 2017, issued in U.S. Appl. No. 14/010,404.
U.S. Final Office Action, dated Dec. 26, 2017, issued in U.S. Appl. No. 14/010,404.
U.S. Office Action, dated Jun. 11, 2018, issued in U.S. Appl. No. 14/010,404.
U.S. Final Office Action, dated Jan. 24, 2019, issued in U.S. Appl. No. 14/010,404.
U.S. Office Action, dated Jun. 26, 2018, issued in U.S. Appl. No. 15/343,089.
U.S. Notice of Allowance, dated Feb. 12, 2019, issued in U.S. Appl. No. 15/343,089.
Taiwan Office Action dated Dec. 11, 2017 issued in Application No. TW 103129240.
Taiwan Final Office Action dated Aug. 8, 2018 issued in Application No. TW 103129240.
Taiwan Office Action [*Decision of Refusal*] dated Dec. 18, 2018 issued in Application No. TW 103129240.
Chyan, Oliver et al. (2003) "Electrodeposition of Copper Thin Film on Ruthenium," *Journal of The Electochemical Society*, 150(5):C347-C350.
Jahnel, Franz (Jan. 2000) "Manual of Guitar Technology: The History and Technology of Plucked String Instruments," *The Bold Strummer Ltd*, p. 116.
Josell, D., et al. (2016) "Superconformal Bottom-Up Cobalt Deposition in High Aspect Ratio Through Silicon Vias" ECS Transactions, The Electrochemical Society, vol. 75, No. 2, (2016) pp. 25-30.
Josell, D., et al. (2016) "Superconformal Bottom-Up Nickel Deposition in High Aspect Ratio Through Silicon Vias" Journal of The Electrochemical Society, vol. 163, No. 7, Apr. 30, 2016, pp. D322-D331.
Kim et al. (2004) "Additive-Free Super-filling in Damascene Cu Electrodeposition Using Microcontact Printing", *Electrochemical and Solid State Letters*, 7(9):C101-C103.
Korean First Office Action dated Feb. 1, 2021 issued in Application No. KR 10-2014-0111787.
U.S. Appl. No. 16/504,717, filed Jul. 8, 2019, Zhu et al.

* cited by examiner

PROCESS FOR OPTIMIZING COBALT ELECTROFILL USING SACRIFICIAL OXIDANTS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

In damascene processing, electrodeposition is commonly used to fill recessed features with cobalt or other metals to fabricate interconnects and other structures. In order to form high quality interconnects, it is important to establish void-free, seam-free fill. In traditional damascene processing, organic additives such as suppressor, accelerator, and leveler are used to establish a bottom-up fill mechanism where the feature is filled from the bottom upwards. The bottom-up fill mechanism forms much higher quality features compared to a conformal fill mechanism, which is likely to form voids and/or seams.

Where a conformal fill mechanism is used, the electrodeposited film is formed at a substantially uniform thickness at all regions of the recessed feature. As the film builds up on the sidewalls of the feature, the sidewalls close in toward one another, forming a seam up the middle of the feature. In many cases, as the sidewalls close in toward one another, they pinch off an area near the top of the feature, preventing electroplating from occurring effectively at positions lower in the feature. This effect leads to the formation of voids within the feature, which are highly undesirable. As mentioned above, these undesirable effects are traditionally avoided through the use of organic additives in the electrolyte that establish a bottom-up fill mechanism, explained further below.

SUMMARY

Certain embodiments herein relate to methods and apparatus for electroplating metal into a recessed feature on a substrate using a superconformal fill mechanism. Also described herein are methods for identifying a set of electroplating conditions that will result in a superconformal fill mechanism, as well as methods for evaluating whether a set of electroplating conditions will result in a superconformal fill mechanism. The disclosed superconformal fill mechanism relies on establishing differential current efficiencies at different parts of a substrate (e.g., within a recessed feature vs. at the field region of a feature, or more specifically, near the bottom of a recessed feature vs. near the top of a recessed feature and the field region). The differential current efficiency results in a greater rate of metal deposition near the bottom of the feature compared to the top of the feature, leading to superconformal fill from the bottom of the feature upwards.

In one aspect of the disclosed embodiments, a method of identifying a set of electroplating conditions that will result in a superconformal fill mechanism is provided, the method including: (a) electroplating a first series of substrates in a first test solution, where a rate of substrate rotation differs between different substrates in the first series of substrates, and where a current density differs between different substrates in the first series of substrates; (b) electroplating a second series of substrates in a second test solution, where the rate of substrate rotation differs between different substrates in the second series of substrates, where the current density differs between different substrates in the second series of substrates, and where the first and second test solutions have different concentrations of a sacrificial oxidant; (c) determining a current efficiency for each substrate in the first and second series of substrates; (d) analyzing the current efficiency and the rate of substrate rotation for each substrate in the first and second series of substrates to identify electroplating conditions, if any, where the current efficiency decreases as the rate of substrate rotation during deposition increases; (e) analyzing the current efficiency and the concentration of sacrificial oxidant for each substrate in the first and second series of substrates to identify electroplating conditions, if any, where the current efficiency decreases as the concentration of sacrificial oxidant increases; (f) analyzing the current efficiency and the current density for each substrate in the first and second series of substrates to identify electroplating conditions, if any, where the current efficiency increases as the current density increases; (g) based on (d)-(f), identifying the set of electroplating conditions that will result in the superconformal fill mechanism, if any, where the set of electroplating conditions that will result in the superconformal fill mechanism include conditions where (i) the current efficiency decreases as the rate of substrate rotation increases, (ii) the current efficiency decreases as the concentration of sacrificial oxidant increases, and (iii) the current efficiency increases as the current density increases.

In some embodiments, the first and second test solutions may include cobalt ions, and a metal being deposited on the substrates in the first and second series of substrates may be cobalt. In a number of such embodiments, the sacrificial oxidant may be hydrogen ion. In various implementations, the sacrificial oxidant, or a material which acts as a source for the sacrificial oxidant, may be selected from the group consisting of: a peroxide, dissolved $O_2$, dissolved $O_3$, $HNO_3$, a sugar acid, $Cl_2$, $Br_2$, and $I_2$, and combinations thereof. The reduction potentials of the sacrificial oxidant and the metal may be balanced against one another to ensure superconformal fill. In various embodiments, a metal being electroplated may reduce at a first reduction potential, the sacrificial oxidant may reduce at a second potential, and for the set of electroplating conditions that will result in the superconformal fill mechanism, a magnitude of the first reduction potential may be greater than a magnitude of the second reduction potential.

The electrolyte may or may not include organic plating additives. In some embodiments, the first and second test solutions may be substantially free of suppressor, accelerator, and leveler. In other embodiments, the first and second test solutions may each include suppressor.

The concentration of metal ions and sacrificial oxidant may be balanced against one another to ensure superconformal fill. In certain embodiments, the first and second test solutions may each include cobalt and hydrogen ions, where a concentration of cobalt ions in the first test solution may be at least about 10 times higher than a concentration of hydrogen ions in the first test solution, and where a concentration of cobalt ions in the second test solution may be at least about 10 times higher than a concentration of hydrogen ions in the second test solution.

In some implementations, the method may further include electroplating an additional substrate using electroplating conditions that fall within the set of electroplating conditions that will result in the superconformal fill mechanism, where the additional substrate includes a plurality of recessed features, and where the recessed features are filled using the superconformal fill mechanism.

In another aspect of the embodiments herein, a method of electroplating a recessed feature on a substrate using a superconformal fill mechanism is provided, the method including: (a) immersing the substrate in electrolyte, the electrolyte including metal ions and a sacrificial oxidant; (b) applying current to the substrate to plate metal in the recessed feature; (c) during (b), depleting a concentration of the sacrificial oxidant within the recessed feature to form a concentration differential with respect to the sacrificial oxidant, where the sacrificial oxidant becomes relatively less abundant within the recessed feature and relatively more abundant in a field region of the substrate; (d) during (b), developing a current efficiency differential, where the current efficiency is relatively higher within the recessed feature and relatively lower in the field region of the substrate; and (e) during (b), using the current efficiency differential to drive the superconformal fill mechanism that deposits metal relatively faster near a bottom of the recessed feature and relatively slower in the field region of the substrate.

In some such embodiments, during (b), the metal ions are not mass transport limited, such that no substantial concentration differential forms with respect to the metal ions. In a particular embodiment, the metal ions may be cobalt ions and the sacrificial oxidant may be hydrogen ions. In some such embodiments, the electrolyte may include about 10-100 mM cobalt ions, about 0.05-0.6 M boric acid, a pH between about 2-4, and a concentration of cobalt ions in the electrolyte may be at least about 10 times higher than a concentration of hydrogen ions in the electrolyte. In these or other embodiments, during (b) the substrate may be rotated at a rate between about 1-100 RPM, and during (b) current may be applied to the substrate at a constant current density of about 4 mA/cm$^2$ or below. In these or other embodiments, the method may further include after (a) and before (b), performing a pre-conditioning step where no current or potential is applied to the substrate for a duration between about 0.25-30 seconds.

In various embodiments, the sacrificial oxidant, or a material that acts as a source for the sacrificial oxidant, may be selected from the group consisting of: a peroxide, dissolved $O_2$, dissolved $O_3$, $HNO_3$, a sugar acid, $Cl_2$, $Br_2$, and $I_2$, and combinations thereof. In some implementations, the electrolyte may be substantially free of suppressor, accelerator, and leveler. In some other implementations, the electrolyte may further include suppressor. In various embodiments, during (b) a current density applied to the substrate may increase from a starting current density to an ending current density, the starting current density being between about 0-4 mA/cm$^2$ and the ending current density being between about 6-10 mA/cm$^2$.

In a further aspect of the disclosed embodiments, an apparatus for electroplating metal into a recessed feature using a superconformal fill mechanism is provided, the apparatus including: an electroplating chamber configured to hold electrolyte; a substrate holder configured to immerse the substrate in the electrolyte; and a controller including executable instructions for: (a) immersing the substrate in electrolyte, the electrolyte including metal ions and a sacrificial oxidant; (b) applying current to the substrate to plate metal in the recessed feature; (c) during (b), depleting a concentration of the sacrificial oxidant within the recessed feature to form a concentration differential with respect to the sacrificial oxidant, where the sacrificial oxidant becomes relatively less abundant within the recessed feature and relatively more abundant in a field region of the substrate; (d) during (b), developing a current efficiency differential, where the current efficiency is relatively higher within the recessed feature and relatively lower in the field region of the substrate; and (e) during (b), using the current efficiency differential to drive the superconformal fill mechanism that deposits metal relatively faster near a bottom of the recessed feature and relatively slower in the field region of the substrate.

These and other features will be described below with reference to the associated drawings.

DETAILED DESCRIPTION

Figure 1A:
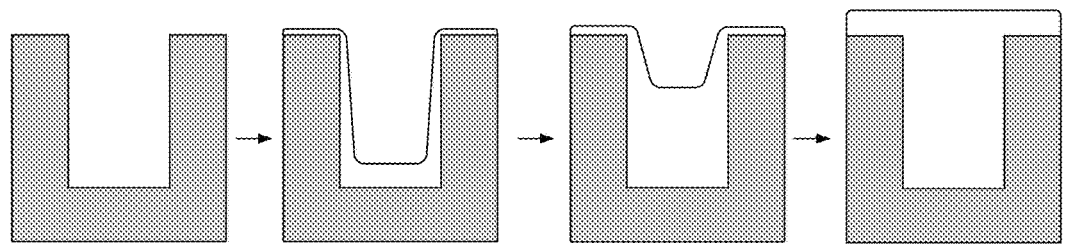
FIG. 1A illustrates a bottom-up fill mechanism.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

A number of embodiments herein are provided in the context of cobalt deposition. However, the embodiments are not so limited. The superconformal fill mechanism described herein may also be used to fill features with copper or other metals.

As mentioned above, conventional electrodeposition processes typically utilize organic additives such as suppressors, accelerators and levelers to achieve a bottom-up fill. Though the embodiments herein do not require the use of these additives, they will be discussed below for the purpose of explaining the conventional bottom-up fill mechanism. In some embodiments, suppressor and/or accelerator and/or leveler may be provided in the electrolyte. In other embodiments, these additives may be omitted.

Suppressors

While not wishing to be bound to any theory or mechanism of action, it is believed that suppressors (either alone or in combination with other bath additives) are surface-kinetic polarizing compounds that lead to a significant increase in the voltage drop across the substrate-electrolyte interface, especially when present in combination with a surface chemisorbing halide (e.g., chloride or bromide). The halide may act as a bridge between the suppressor molecules and the wafer surface. The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

Although suppressors adsorb onto a substrate surface, it is believed that they are not incorporated into the deposited film and may slowly degrade over time. Compounds which do not principally act by adsorbing onto a substrate surface are not considered suppressors. Suppressors are often relatively large molecules, and in many instances they are polymeric in nature (e.g., polyethylene oxide, polypropylene oxide, polyethylene glycol, polypropylene glycol, etc.). Other examples of suppressors include polyethylene and polypropylene oxides with S- and/or N-containing functional groups, block polymers of polyethylene oxide and polypropylene oxides, etc. The suppressors can have linear chain structures or branch structures. It is common that suppressor molecules with various molecular weights co-exist in a commercial suppressor solution. Due in part to suppressors' large size, the diffusion of these compounds into a recessed feature is relatively slow.

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator). Example accelerators include, but are not limited to, dimercaptopropane sulfonic acid, dimercaptoethane sulfonic acid, mercaptopropane sulfonic acid, mercaptoethane sulfonic acid, bis-(3-sulfopropyl) disulfide (SPS), and their derivatives. Although the accelerator may become strongly adsorbed to the substrate surface and generally laterally-surface immobile as a result of the plating reactions, the accelerator is generally not incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors. Compounds which do not principally act by adsorbing onto a substrate surface are not considered to be accelerators.

Levelers

While not wishing to be bound by any theory or mechanism of action, it is believed that levelers (either alone or in combination with other bath additives) act as suppressing agents to counteract the depolarization effect associated with accelerators, especially in the field region and at the side walls of a feature. The leveler may locally increase the polarization/surface resistance of the substrate, thereby slowing the local electrodeposition reaction in regions where the leveler is adsorbed. The local concentration of levelers is determined to some degree by mass transport. Therefore, levelers act principally on surface structures having geometries that protrude away from the surface. This action "smooths" the surface of the electrodeposited layer. It is believed that leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Compounds which do not principally act by adsorbing onto a substrate surface are not considered levelers. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be especially useful. Leveler compounds may also include ethoxide groups. For example, the leveler may include a general backbone similar to that found in polyethylene glycol or polyethyelene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be especially useful. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Bottom-Up Fill Promoted by Organic Additives

In a bottom-up fill mechanism, illustrated in FIG. 1A, a recessed feature on a plating surface tends to be plated with metal from the bottom to the top of the feature, and to a lesser degree, inward from the side walls towards the center of the feature. It is important to control the deposition rate within the feature and in the field region in order to achieve uniform filling and avoid incorporating voids into the features. In conventional applications, the three types of additives described above are necessary in accomplishing bottom-up fill, each working to selectively increase or decrease the polarization at particular regions on the substrate surface.

After the substrate is immersed in electrolyte, the suppressor adsorbs onto the surface of the substrate, especially in exposed regions such as the field region. At the initial plating stages, there is a substantial differential in suppressor concentration between the top and bottom of a recessed feature. This differential is present due to the relatively large size of the suppressor molecule and its correspondingly slow transport properties. Over this same initial plating time, it is believed that accelerator accumulates at a low, substantially uniform concentration over the entire plating surface, including the bottom and side walls of the feature. Because the accelerator diffuses into features more rapidly than the suppressor, the initial ratio of accelerator:suppressor within the feature (especially at the feature bottom) is relatively high. The relatively high initial accelerator:suppressor ratio within the feature (especially at the feature bottom) promotes rapid plating near the bottom of the feature compared to the top of the feature. Meanwhile, the initial plating rate in the field region and toward the top of the feature is relatively low due to the lower ratio of accelerator:suppressor. Thus, in the initial plating stages, plating occurs relatively faster within the feature, particularly near the feature bottom, and relatively slower in the field region and toward the top of the feature.

As plating continues, the feature fills with metal and the surface area within the feature is reduced, as shown in FIG. 1A. Because of the decreasing surface area and the accelerator substantially remaining on the surface, the local surface concentration of accelerator within the feature (especially at the feature bottom) increases as plating continues. This increased accelerator concentration near the feature bottom helps maintain the differential plating rate needed for bottom-up fill.

In the later stages of plating, particularly as overburden deposits, the accelerator may build up in certain regions (e.g., above filled features) undesirably, resulting in local faster-than-desired plating. Leveler is conventionally used to counteract this effect. The surface concentration of leveler is greatest at exposed regions of a surface (i.e., not within recessed features) and where convection is greatest. It is believed that the leveler displaces accelerator, increases the local polarization and decreases the local plating rate at regions of the surface that would otherwise be plating at a rate greater than at other locations on the deposit. In other words, the leveler tends, at least in part, to reduce or remove the influence of an accelerating compound at the exposed regions of a surface, particularly at protruding structures. In conventional applications, a feature may tend to overfill and produce a bump in the absence of leveler. Therefore, in the later stages of conventional bottom-up fill plating, levelers are beneficial in producing a relatively flat deposit.

The use of suppressor, accelerator and leveler, in combination, have traditionally allowed a feature to be filled without voids from the bottom-up, while producing a relatively flat deposited surface. The exact identity/composition of the additive compounds are typically maintained as trade secrets by the additive suppliers, thus, information about the exact nature of these compounds is not publicly available.

One problem with additive-based bottom-up fill is that it is difficult to practice where very small feature sizes are used. This may be because it is difficult or impossible to diffuse the additives into the features as needed when the features are sufficiently small, e.g., due to the size of the additives compared to the feature size, and/or due to the short timeframes for filling such small volumes. For example, in various cases where the features are very small, the features may fill more quickly than the timeframe needed for the additives to diffuse into the features and establish differential plating rates, as described above. In many cases, additive-based bottom-up fill is only effective at feature sizes (widths) of about 20 nm or greater. In a number of embodiments herein, feature sizes may be about 30 nm or less, for example about 20 nm or less, or about 15 nm or less, or about 10 nm or less. Because the embodiments herein do not rely on the described additives, they can be practiced even at extremely small feature sizes, e.g., down to about 2 or 3 nm.

Another problem associated with additive-based bottom-up fill is the incorporation of impurities into the electrodeposited film. Because additive-based bottom-up fill relies on direct interactions between the organic additive molecules and the plated metal surface, these processes are prone to incorporation of elements from the additives into the deposited film. Such impurities are further discussed below in the context of FIGS. 3A and 3B.

Conformal Fill

Figure 1B:
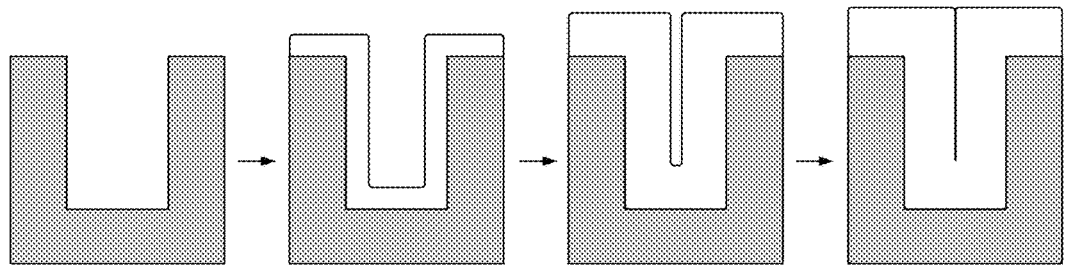
FIG. 1B illustrates a conformal fill mechanism.

The bottom-up fill mechanism described above in relation to FIG. 1A can be contrasted with the conformal fill mechanism shown in FIG. 1B. As shown in FIG. 1B, where conformal plating is used, the film plates at a relatively uniform thickness on all of the surfaces, including both the bottom and the sidewalls of the feature. While conformal plating can be used to fill features, it typically results in a seam up the middle of the feature where the two sidewalls meet. Moreover, in many cases conformal plating can lead to the formation of voids within features. Such voids can be formed as the sidewalls of the feature approach one another and pinch off a region toward the top of the feature. This pinching off prevents electroplating from occurring at positions that are lower in the feature, resulting in the formation of a void, rather than a tight seam. Electrolyte can become trapped in these voids. Both seams and voids are undesirable in a filled feature.

Superconformal Fill Promoted by Sacrificial Oxidants

Figure 2:
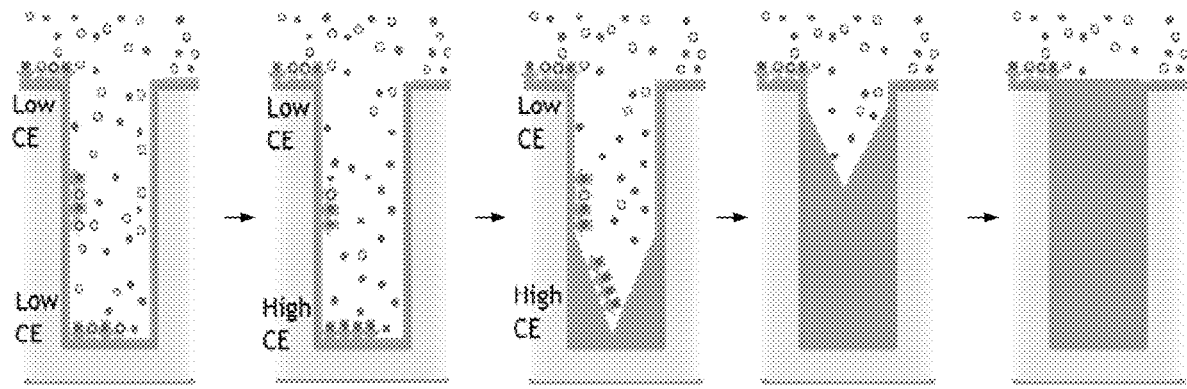
FIG. 2 illustrates a superconformal fill mechanism according to certain embodiments.

A superconformal fill mechanism is one in which film deposits relatively faster near the bottom of a recessed feature and relatively slower near the top of the feature. Bottom-up fill is one kind of superconformal fill mechanism. In bottom-up fill, the bottom of a partially filled feature may remain relatively flat throughout much of the fill process, as shown in FIG. 1A. As used herein, superconformal fill also includes cases where the deposited film forms in a V-shape within a partially filled feature throughout much of the fill process, as shown in FIG. 2.

Conventionally, it was believed that the plating additives described above were necessary to establish superconformal fill within a recessed feature. However, in the embodiments herein, an alternative superconformal fill process is provided that does not rely on such plating additives. Although such additives may be used in some implementations, they are not needed to establish superconformal fill. Instead, superconformal fill is accomplished by balancing several plating conditions to ensure differential plating rates within the feature. In this way, a relatively high plating rate can be established at the bottom of the feature compared to the top of the feature, leading to high quality superconformal fill and avoiding the formation of seams and voids.

The differential plating rate may be established by providing a sacrificial oxidant that is more abundant and/or active on the field region and near the top of the feature compared to the bottom of the feature. As used herein, the term sacrificial oxidant refers to a solution in the electrolyte that is reduced at the electrode (e.g., substrate) surface instead of the metal ion of interest.

The sacrificial oxidant effectively diverts current that would otherwise be used to reduce/deposit metal. Because the plating conditions (e.g., electrolyte composition, applied current and/or potential, and convection conditions (e.g., rotation rate of the substrate)) are tailored to ensure that the sacrificial oxidant is more active and/or abundant on the field region and near the top of the feature compared to the bottom of the feature, and because the sacrificial oxidant affects the local current efficiency (e.g., the fraction of current that goes toward reducing metal), a differential current efficiency is established within the feature. In other words, near the top of the feature where the sacrificial oxidant is relatively more abundant or active, a relatively greater proportion of the deposition current is diverted to reducing the sacrificial oxidant, and relatively less metal is deposited. By contrast, near the bottom of the feature where the sacrificial oxidant is relatively less abundant or active, a relatively lower proportion of the deposition current is diverted to reducing the sacrificial oxidant, and relatively more metal is deposited.

The result is that differential metal plating rates are established at different parts of the feature, with metal plating occurring faster near the bottom of the feature and slower near the top of the feature and in the field region. Similarly, differential sacrificial oxidant reduction rates are established at different parts of the feature, with sacrificial oxidant reduction occurring at a greater rate near the top of the feature, and at a lower rate near the bottom of the feature. The differential current efficiency at different regions of the feature results in superconformal fill, without any need to rely on organic additives such as suppressor, accelerator, and leveler.

This fill mechanism is illustrated in FIG. 2, which is described in the context of cobalt deposition. The cobalt ions are shown as dark circles, while the sacrificial oxidant molecules are shown as light circles. Toward the beginning of the deposition process, both cobalt ions and sacrificial oxidant molecules diffuse into the feature. Because of the initial abundance of sacrificial oxidant molecules, there is a relatively low current efficiency (CE) at both the bottom and top of the feature.

After a short period of time, the sacrificial oxidant molecules become depleted near the feature bottom, and a relatively higher current efficiency is established near the bottom of the feature compared to the top of the feature. The sacrificial oxidant depletes more substantially within the feature compared to the field region due to the relatively higher surface area to volume ratio within the feature. The sacrificial oxidant molecules continue to diffuse into the feature to some degree, and due to the balance of plating conditions and feature shape, the sacrificial oxidant molecules become more abundant (and/or active) near the top of the feature compared to the bottom of the feature. This differential abundance and/or activity of the sacrificial oxidant molecules arises at least partly because these molecules have to diffuse from the bulk solution down toward the feature bottom, and because sacrificial oxidant molecules are chosen such that they require less energy to reduce than the metal being deposited.

As the deposition process continues, the relatively high current efficiency near the bottom of the feature compared to the top of the feature results in a greater degree of cobalt deposition near the bottom of the feature compared to the top of the feature. This trend continues as the feature is filled from the bottom upwards.

In most conventional electroplating approaches, one of the goals is to maximize current efficiency. Current efficiency can be defined as follows:

$$\text{Current Efficiency} = \frac{I_M}{I_T} \quad \text{Equation 1}$$

where,
$I_M$=the current that acts to deposit metal, and
$I_T$=the total current applied to the substrate $I_T$ can be measured directly based on the number of coulombs applied to the substrate over time during processing. $I_M$ can be calculated based on the amount (e.g., thickness) of metal deposited on the substrate over time during processing.

Current efficiency can be considered both as an overall value reflecting the entire electroplating process/feature, and as a local value reflecting a particular portion of the substrate/feature. It is generally desirable to maximize current efficiency in order to minimize the amount of wasted current/power during processing. In conventional cases, the "wasted" current (current that is applied to the substrate but not used to deposit metal) can be calculated as follows:

$$\text{Wasted Current} = I_T - I_M \quad \text{Equation 2:}$$

In conventional approaches, electroplating processes are optimized to minimize the wasted current (such that $I_M$ is very close to $I_T$), thereby maximizing the current efficiency toward 1. This approach minimizes processing costs associated with power delivery. Further, this approach minimizes processing time (e.g., because a high proportion of current is used to deposit metal, it takes relatively less time to fill a feature). Another reason that conventional electroplating approaches optimize for high current efficiency is to maintain a stable electrolyte composition. In cases where current efficiency is low and a relatively high proportion of current is diverted to reducing other species in the electrolyte, the concentration of such species can change over time, which is typically undesirable for establishing uniform processing conditions and electroplating results.

The embodiments herein use a different approach, specifically optimizing for a low current efficiency near the top of the recessed feature and in the field region. This approach is quite different from conventional techniques, as the current efficiency is being optimized in a substantially different way, and for different reasons.

The disclosed superconformal plating mechanism provides a number of advantages over traditional approaches that rely on organic plating additives. For example, the disclosed mechanism scales very well with feature size, and can be used to fill smaller features compared to additive-based processes. Additive-based processes are typically unsuccessful below a particular feature size, for example because the additives (e.g., large suppressor molecules, etc.) may not be able to diffuse into the features as needed to establish differential plating rates. This may be because the additives are too large to fit into the features, and/or because the features fill too quickly (e.g., due to low volume) for the additives to diffuse into and adsorb onto the feature to establish the required concentrations, where needed. By contrast, with the disclosed superconformal mechanism, smaller features may benefit even more greatly (e.g., fill may be superconformal to a greater degree) than relatively larger features, e.g., due to the relatively higher surface area to volume ratio in the smaller features. The high surface area to volume ratio promotes depletion of the sacrificial oxidant molecules, which drives the differential plating rates and the resulting superconformal fill. Further, because the disclosed mechanism relies on diffusion of small molecules (the sacrificial oxidant molecules) inside the feature (e.g., as opposed to large suppressor molecules or other large additive molecules), the inability of large macromolecular additive molecules does not deleteriously affect the fill behavior.

Moreover, because the disclosed superconformal fill mechanism does not rely on direct adsorption of organic additive molecules, the likelihood of incorporating unwanted contaminants into the film is minimized. One reason to avoid such contaminants is that they undesirably increase the roughness and resistivity of the deposited film. Low resistivity is important for producing high quality connections in semiconductor devices. Another reason to avoid such contaminants is that the slurries used for chemical-mechanical polishing (CMP) processes (which typically occur after the features are filled) are sensitive to even small amounts of impurities in the film. This is particularly true for sulfur impurities, which can produce significant corrosion during the planarization process.

Figure 3A:
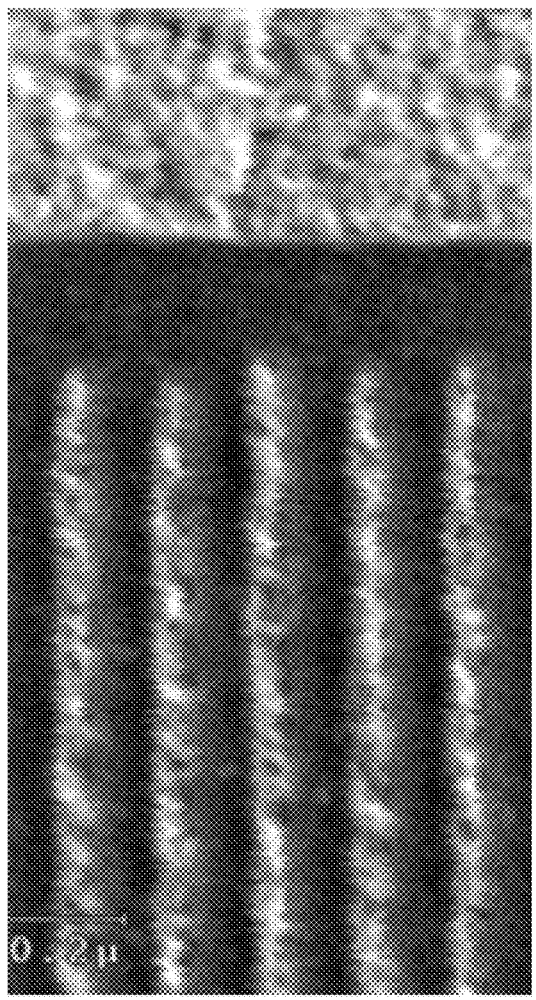
FIGS. 3A and 3B present views of an electroplated substrate after a chemical mechanical polishing operation.
Figure 3B:
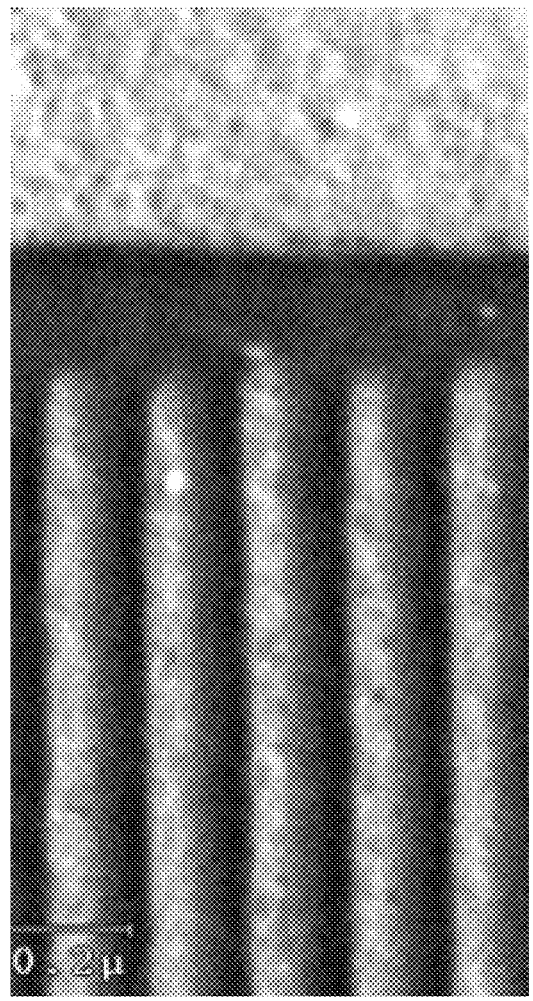

FIGS. 3A and 3B illustrate a comparison between post-CMP results for a cobalt film that includes sulfur impurities (FIG. 3A) and a cobalt film with a negligible sulfur content (FIG. 3B). The film in FIG. 3A shows unacceptable CMP results, illustrating a rough surface as shown by the high contrast between different areas of the film. The dark contrast on the lines indicates the presence of large voids in the film. The film in FIG. 3B shows acceptable CMP results, illustrating a film that is substantially less rough and higher quality.

Although the disclosed superconformal fill mechanism is attractive in theory, in practice it can be quite difficult to adequately balance all of the relevant process conditions to ensure that the required differential current efficiency is established (e.g., at different portions of the feature, and within the feature compared to the field region). Specific parameters which are balanced against one another include: (a) the ratio of metal ion to sacrificial oxidant molecule, (b) the concentration of metal ion, (c) the concentration of sacrificial oxidant molecule, (d) the degree of convective mass transport (which may be affected by the rotation rate of the substrate, for example), (e) temperature of the electrolyte, and (f) the relative and absolute reduction potentials of the metal ions and sacrificial oxidant molecules (which may be affected by complexation or lack thereof, concentration of the relevant species, the material of the substrate, the choice (composition) of the metal ion, and the choice (composition) of the sacrificial oxidant molecule).

Also disclosed herein are methods for designing an electroplating process to take advantage of the disclosed superconformal fill mechanism. Such methods are described in the context of FIGS. 4-6.

Figure 4:
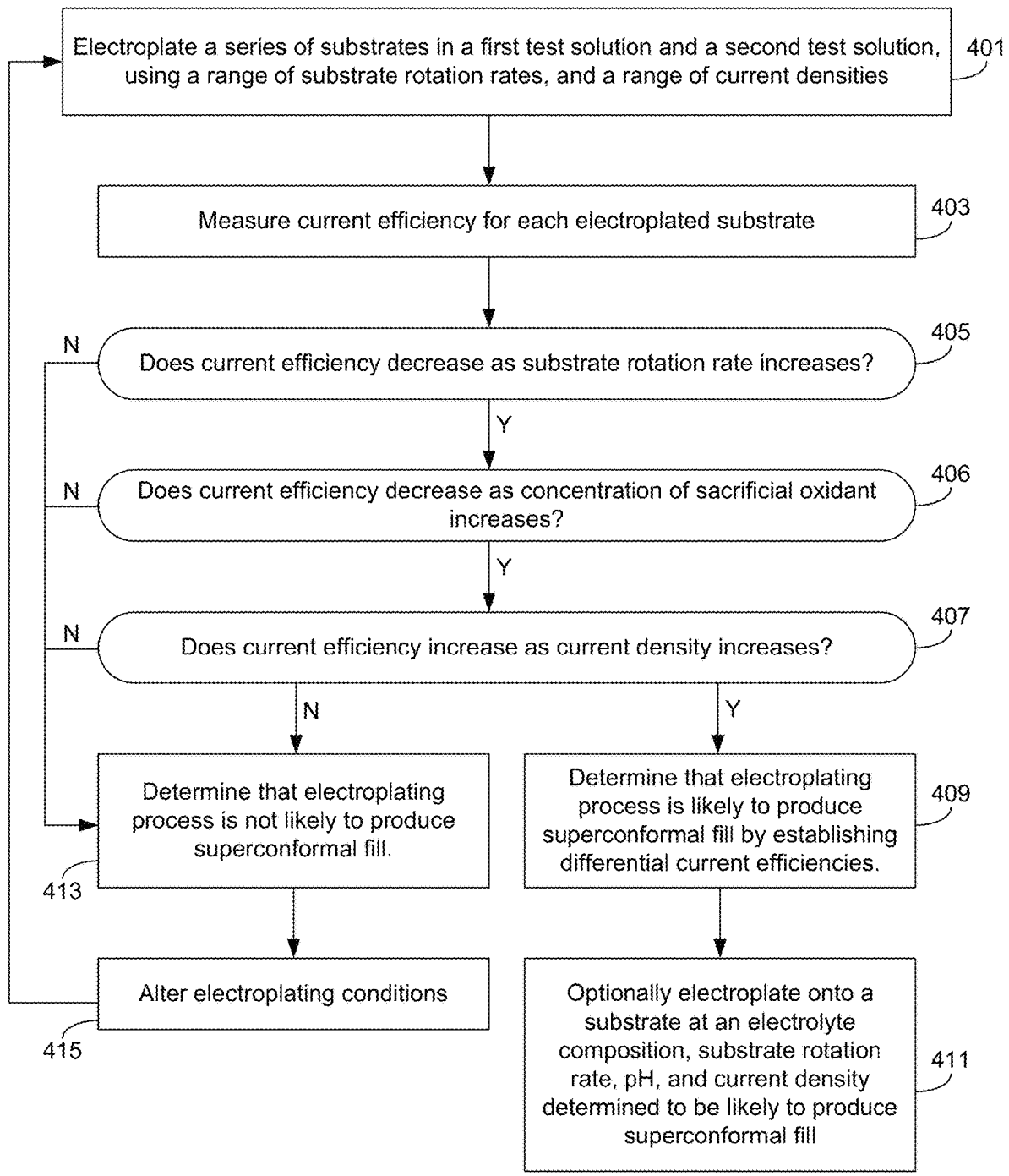
FIG. 4 provides a flow chart for a method of evaluating whether a set of electroplating conditions will lead to a desired superconformal fill mechanism.

FIG. 4 is a flowchart describing a method of designing/testing an electroplating process to achieve superconformal fill. The method begins at operation 401, where a series of substrates are electroplated in at least a first test solution and a second test solution, over a range of different substrate rotation rates, and over a range of different current densities. The first test solution and the second test solution (and additional test solutions, if provided) may have the same composition except for having differing concentrations of sacrificial oxidant molecules. In various embodiments where the sacrificial oxidant is $H^+$, the two test solutions may have the same composition except for having differing pH values.

Figure 5:
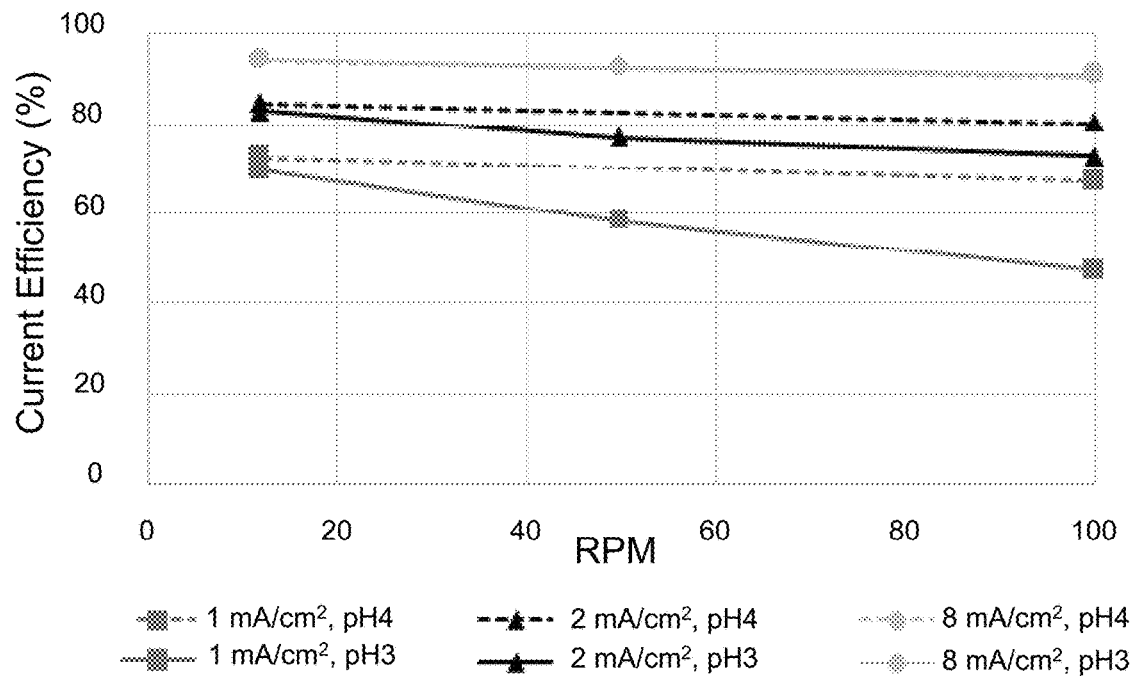
FIG. 5 shows experimental results depicting current efficiency over a range of substrate rotation rates, electrolyte pH values, and current densities.

In operation 403, the current efficiency is measured for each electroplated substrate. Example results are plotted in FIG. 5. In the context of FIG. 5, two different test solutions were tested, a first test solution having a pH of about 3 and a second test solution having a pH of about 4. Three different substrate rotation rates (about 12 RPM, about 50 RPM, and about 100 RPM) were tested, and three different constant current densities (about 1 $mA/cm^2$, about 2 $mA/cm^2$, and about 8 $mA/cm^2$) were tested. The resulting current efficiencies for each example are shown in FIG. 5.

In operation 405, it is determined whether the current efficiency decreases as the substrate rotation rate increases. For the example shown in FIG. 5, it can be seen that for each given test solution and current density, current efficiency is lower at the higher substrate rotation rates. In other words, as the rate of substrate rotation increases, the current efficiency decreases. This relationship indicates that over the tested plating conditions, the sacrificial oxidant is mass transport limited, a condition that is needed for the disclosed superconformal fill mechanism to be successful. Larger differences in current efficiency indicate better superconformal fill conditions, as this difference indicates that the current efficiency is relatively more sensitive to mass transport control of the sacrificial oxidant species.

In cases where the current efficiency decreases as the substrate rotation rate increases, the method continues at operation 406, where it is determined whether the current efficiency decreases as the concentration of the sacrificial oxidant increases. A negative correlation between current efficiency and the concentration of sacrificial oxidant indicates that the decrease in current efficiency is related to increased competition between reduction of the metal ions and reduction of the sacrificial oxidant molecules. In other words, this relationship provides an indication of whether the different reduction reactions are properly balanced against one another. In cases where the sacrificial oxidant is $H^+$, operation 406 involves determining whether the current efficiency decreases as the pH of the test solutions decrease.

In the context of FIG. 5, the current efficiency decreases as the pH of the test solutions decrease (e.g., as the concentration of sacrificial $H^+$ in the test solutions increase), at least for certain tested current densities. The decrease in current efficiency with lower pH was true at all tested substrate rotation rates in cases where the current density during plating was 1 $mA/cm^2$ or 2 $mA/cm^2$. Where the current density was 8 $mA/cm^2$ during plating, the difference in pH had no substantial effect on the current efficiency. This may indicate that for the conditions tested, superconformal fill is likely to occur at the lower current densities, e.g., 1 and 2 $mA/cm^2$, but likely will not be successful (or as successful) at current densities as high as 8 $mA/cm^2$. Additional current densities, pH values, and substrate rotation rates may be tested in order to determine the limits of the conditions likely to lead to superconformal fill, if desired.

In cases where the current efficiency decreases as the concentration of sacrificial oxidant increases, the method continues with operation 407, where it is determined whether the current efficiency increases as the current density increases. A positive correlation between the current efficiency and the current density indicates that the reductive potential and concentration of the sacrificial oxidant are properly tuned. In the context of FIG. 5, for a given substrate rotation rate and pH, higher current densities show higher current efficiencies, indicating that the reductive potential and sacrificial oxidant concentrations tested are likely to lead to the desired superconformal fill.

In cases where a set of conditions is identified where (a) the current efficiency decreases as the substrate rotation rate increases (e.g., operation 405=yes), (b) the current efficiency decreases and the concentration of sacrificial oxidant increases (e.g., operation 406=yes), and (c) the current efficiency increases as the current density increase (e.g., operation 407=yes), the method continues with operation 409, where it is determined that the identified set of conditions is likely to produce the desired superconformal fill mechanism that relies on establishing different current efficiencies at different parts of a feature/substrate. The listed current efficiency trends need not hold true over the entire range of tested conditions. In fact, identifying cases where the trends break down may indicate the limits of the conditions likely to lead to superconformal fill. In the example of FIG. 5, because the current efficiency is essentially unaffected by the change in pH (i.e., the change in the concentration of the sacrificial oxidant molecule) when the current density was 8 mA/cm$^2$, this may indicate that the current density should be kept below about 8 mA/cm$^2$ to produce superconformal fill. As mentioned, additional testing can be pursued to more accurately characterize the outer limits of the acceptable processing window.

The method may optionally continue with operation 411, where a substrate may be electroplated using a set of conditions identified in operations 401-409 to be likely to produce superconformal fill.

In cases where either (a) the current efficiency does not decrease as the substrate rotation rate increases (e.g., operation 405=no), (b) the current efficiency does not decrease as the concentration of sacrificial oxidant increases (e.g., operation 406=no), or (c) the current efficiency does not increase as the current density increases (e.g., operation 407=no), the method continues with operation 413, where it is determined that the electroplating conditions tested are not likely to produce superconformal fill. In various embodiments, the method may then continue with operation 415, where the electroplating conditions are altered. This may involve, e.g., (i) changing the concentration of sacrificial oxidant molecules, (ii) changing the concentration of metal ions, (iii) changing the rotation rate of substrate during deposition, (iv) changing the temperature of electrolyte and/or substrate, (v) changing the complexation (if any) of the metal ion, (vi) changing the complexation (if any) of the sacrificial oxidant molecule, (vii) changing the identity/composition of sacrificial oxidant molecule, (viii) changing the current density during deposition, (ix) changing the composition of the test solutions to adjust a concentration of one or more organic additives (e.g., suppressor), which may or may not be present.

Figure 6:
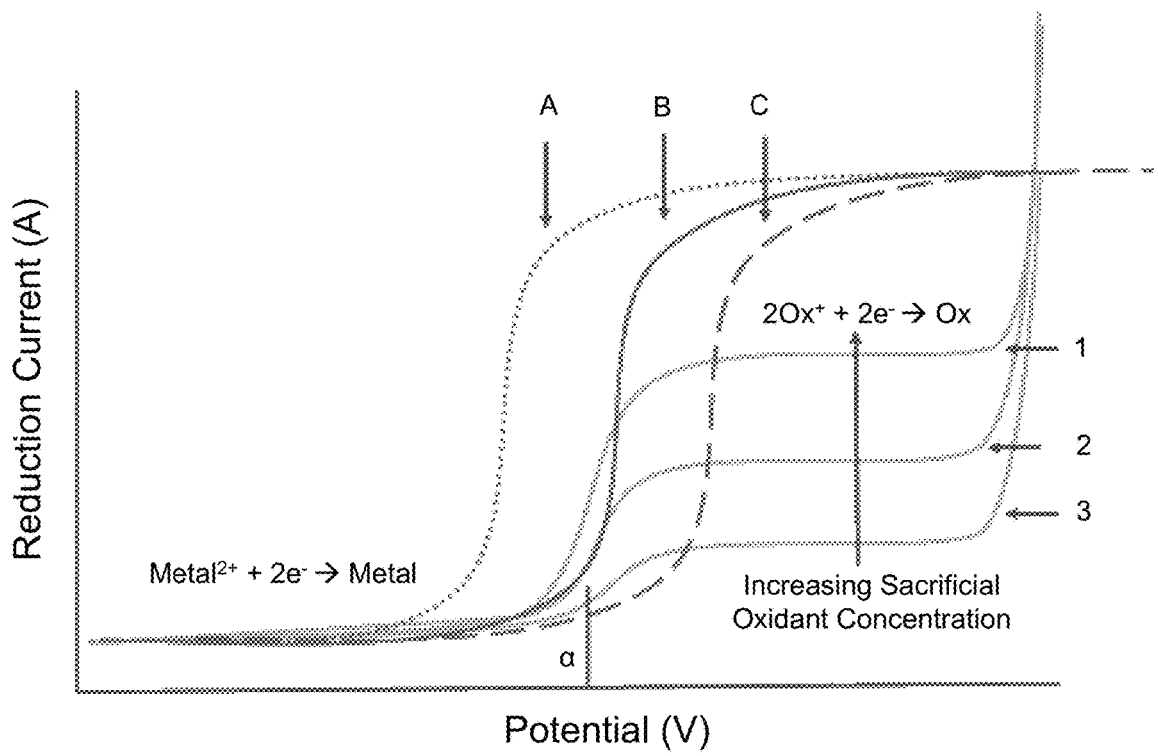
FIG. 6 is a graph of reduction current vs. potential, further explaining the disclosed superconformal fill mechanism.

FIG. 6 provides a schematic of the electrochemical interaction between a metal reduction reaction and a sacrificial oxidant reduction reaction in an electroplating system where a sacrificial oxidant is provided to establish differential current efficiencies at different portions of the feature/substrate. This figure can be used to further explain the disclosed superconformal fill mechanism and the considerations that go into designing an electroplating process to take advantage of this mechanism. The traces in FIG. 6 depict the expected reduction current observed during the application of a ramping potential applied to the substrate. In each trace, the reduction current starts at zero, then begins to increase close to the relevant reduction potential. At values well above the reduction potential, the reactions are mass transport limited, and the reduction current levels off.

Traces 1, 2, and 3 illustrate the traces related to reduction of sacrificial oxidant molecules, with the three different traces relating to three different concentrations of sacrificial oxidant molecules. Trace 1 relates to the highest concentration of sacrificial oxidant molecules, while trace 3 relates to the lowest concentration of sacrificial oxidant molecules. In cases where the sacrificial oxidant molecule is H$^+$, trace 1 relates to the lowest pH, and trace 3 relates to the highest pH. As expected, trace 1 shows the highest level of reduction current at a given potential within the mass-transport-limited regime (e.g., where traces 1-3 are fairly flat/horizontal), indicating that more reduction current is used to reduce the sacrificial oxidant molecules where such molecules are relatively more abundant.

Traces A, B, and C illustrate the traces related to reduction of metal ions. These traces relate to a constant metal ion concentration, but three different reduction potentials. The reduction potentials can be adjusted higher by using a complexing agent that acts to (a) stabilize the metal ions (e.g., Co$^{2+}$) in solution and/or (b) obscure an active deposition site on the substrate. The reduction potentials can be adjusted lower by using a complexing agent that acts to (a) stabilize a reaction intermediate (e.g., Co$^+$) in solution and/or (b) creates a catalytic site on the substrate. Temperature of the electrolyte and/or substrate may also affect traces 1-3 and A-C.

In traditional damascene electroplating approaches, it is preferable to ensure that reduction of the metal ions is not affected by other reduction reactions that may take place. In other words, it is preferable to ensure that the metal ions are reduced at a potential that is sufficiently below the potential at which any other oxidants are reduced. In the context of FIG. 6, traditional damascene processes would prefer to operate at trace A. Because the potential at which metal is reduced in trace A is significantly below the reduction potential at which the sacrificial oxidant (if present) is reduced (e.g., in FIG. 5 the reduction potential at which trace A deposits metal is significantly below the reduction potential at which the sacrificial oxidant is reduced, for all concentrations of the sacrificial oxidant shown), the reaction can proceed at a high degree of current efficiency, with little or no current being diverted to reduce the sacrificial oxidant. This result is desirable in conventional damascene methods for the reasons described above.

By contrast, where the disclosed superconformal fill mechanism is desired, it is important to ensure that both the metal reduction reaction and the sacrificial oxidant reduction reaction occur at similar reduction potentials, such that these reactions can compete with one another during deposition. Further, it is desirable to ensure that the potential at which metal is reduced is one that achieves different levels of sacrificial oxidant reduction, depending on the concentration of the sacrificial oxidant. This ensures that if and when a concentration gradient of the sacrificial oxidant develops within the feature (e.g., with the sacrificial oxidant being more abundant in the field region and near the top of the feature, and more scarce near the bottom of the feature), this concentration gradient leads to differing levels of current being diverted to reducing the sacrificial oxidant, thereby leading to differential current efficiencies at different portions of the feature/substrate. The conditions leading to trace A would not result in the disclosed superconformal fill mechanism at least because there would be no substantial competition between metal reduction and sacrificial oxidant reduction within the feature. Instead, substantially all of the total reduction current would be used to reduce metal, and a conformal fill mechanism is likely to result (at least in cases where no organic additives are used).

In one example, the metal reduction reaction is $Co^{2+}+2e^- \rightarrow Co$, and the sacrificial oxidant reduction reaction is $2H^++2e^- \rightarrow H_2$. The cobalt is provided at a concentration such that the cobalt reduction reaction proceeds according to trace B. The electrolyte has a bulk pH of about 3. Trace 1 relates to the hydrogen reduction reaction at pH 3, trace 2 relates to the hydrogen reduction reaction at a higher pH, e.g., about 3.5, and trace 3 relates to the hydrogen reduction reaction at the highest pH, e.g., about 4. The reduction potential used during deposition is a. The plating conditions are chosen to ensure that during plating, a hydrogen ion concentration gradient develops within the feature. This concentration gradient develops at least in part as a result of the high surface area to volume ratio within the feature. The high surface area to volume ratio promotes rapid depletion of the hydrogen ions within the feature. The plating conditions may be chosen according to the method described in relation to FIG. 4, for example.

The resulting hydrogen ion concentration gradient within the feature means that the hydrogen reduction reaction will occur at different degrees at different portions of the feature. For example, where the hydrogen ions are most concentrated (e.g., in the bulk solution or near the top of the feature/field region where pH is about 3, represented by trace 1), the hydrogen reduction reaction occurs to the greatest degree. This is indicated by the fact that trace 1 has the highest reduction current at a given potential. Similarly, where the hydrogen ions are least concentrated (e.g., near the bottom of the feature where the $H^+$ is depleted and the pH is closer to about 4, represented by trace 3), the hydrogen reduction reaction occurs to the lowest degree. This is indicated by the fact that trace 3 has the lowest reduction current at a given potential. The result is that near the top of the feature, much of the reduction current is diverted to reducing the hydrogen ions, and the current efficiency in this region is low. This means that relatively less cobalt is being deposited near the top of the feature. Likewise, near the bottom of the feature, very little of the reduction current is diverted to reducing the hydrogen ions, and the current efficiency in this region is relatively high. This means that relatively more cobalt is deposited near the bottom of the feature. The resulting fill mechanism is superconformal, with the feature being filled from the bottom upwards.

In certain embodiments where the metal reduction reaction occurs according to trace A or C, a suppressor may be provided to the plating solution to shift the metal reduction reaction so that it more closely resembles trace B (in terms of overlapping with traces 1-3). Moreover, because of the diffusion considerations involved, the suppressor may preferentially act to shift the metal reduction potential more in the field region (where the suppressor is more abundant) than within the feature (where the suppressor is relatively less abundant). In this case, metal deposition on the field region may proceed closer to trace C, while within the feature the metal deposition proceeds closer to trace A. This can result in a very large difference in current efficiency between the bottom of the feature and the field region.

The combination of shifting the deposition potential through use of a suppressor, along with sacrificial oxidant depletion, is quite powerful in terms of achieving different current efficiencies and metal deposition rates at different portions of a feature/substrate. For instance, if the region within the feature (e.g., near the bottom of the feature) is not experiencing a potential shift due to lack of suppressor within the feature (trace B), and the concentration of sacrificial oxidant within the feature is depleted (trace 3), then the current efficiency near the bottom of the feature will be quite high. In this same example, if the field region of the feature experiences a suppressive potential shift due to the presence of suppressor in the field region (trace C) and the concentration of sacrificial oxidant is relatively high in the field region where it is not depleted (trace 1), then the current efficiency in the field region will be quite low. The difference in current efficiency at different regions of the feature/substrate leads to the desired superconformal fill.

In certain embodiments, organic plating additives such as suppressor, accelerator, and leveler may be omitted from the electrolyte. In other embodiments, one or more of these additives may be provided. The additives may act to enhance the superconformal fill mechanism, as described. The additives (e.g., suppressor, in some cases) may provide polarization differences typical of traditional damascene fill chemistries, enhancing the superconformal nature of the fill mechanism by interfering with metal deposition to a greater degree on the field region compared to within the feature. Moreover, the additives may affect the activity of the sacrificial oxidant molecules. In some implementations, the additives may interfere with the reduction of the sacrificial oxidant molecules in the feature to a greater extent than in the field region. This would further promote a greater degree of metal plating within the feature compared to the field region. Further, the additives may act to modulate the relative reduction potentials of the metal ions and the sacrificial oxidant molecules, for example through complexation in solution and/or through modification of the surface of the substrate. The identity and concentration of any such additives can be tailored to correctly distribute the additive activity between the field region and within the feature.

Unexpectedly, an electroplating process that is well optimized to take advantage of the disclosed superconformal fill mechanism is expected to have a lower overall current efficiency compared to even poorly optimized conventional electroplating processes (which typically are designed for high current efficiency). It was not previously known or expected that low current efficiency processes were in any way beneficial for superconformal fill. Indeed, low current efficiency approaches have been avoided in practice.

Figure 7:
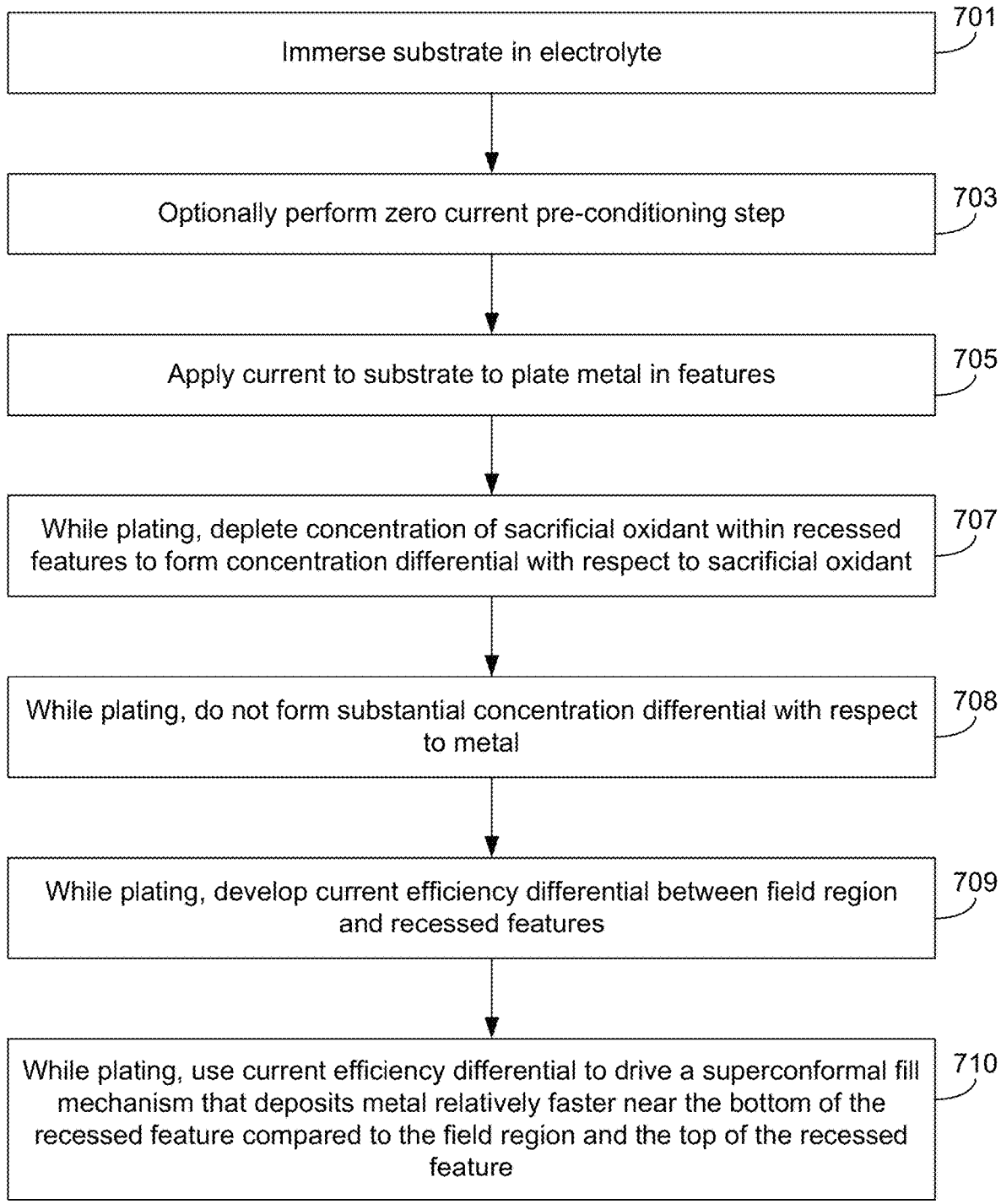
FIG. 7 is a flow chart for a method of electroplating a substrate with a superconformal fill mechanism according to certain embodiments.

FIG. 7 illustrates a flowchart for a method of electroplating metal onto a substrate to achieve superconformal fill according to certain embodiments. The method begins at operation 701, where a substrate is immersed in electrolyte. The substrate may be immersed at an angle to avoid trapping bubbles under its surface. The substrate may be rotated during immersion.

At operation 703, an optional pre-conditioning step may be performed. The pre-conditioning step involves a short time period (e.g., 0-30 seconds, in some cases at least about 0.25 seconds, at least about 0.5 seconds, at least about 1 second, at least about 5 seconds, or at least about 10 seconds) after immersion, with no reductive current being passed to the substrate. Metals that are exposed to atmosphere gain a coating of native oxide on their surface. Metals with more cathodic reduction potentials (which are generally better suited to the application of the disclosed superconformal fill mechanism that relies on differential current efficiencies) are particularly susceptible to formation of such oxides. This native oxide can interfere with nucleation during electroplating. By providing a short time period after immersion where no reductive current is passed to the substrate, this native oxide can be removed by the corrosive activity of the electrolyte.

At operation 705, current is applied to the substrate to cause metal to be plated in the features. The various plating conditions are balanced against one another as described herein to ensure that a differential current efficiency develops between the field region and within the feature, as discussed further in relation to operations 707-710, below. For example, the current efficiency is relatively high within the feature, particularly near the bottom of the feature, and is relatively low in the field region and near the top of the feature.

In some embodiments, a constant current density is provided while metal is plated in the features. In certain implementations, a constant current density of about 4 $mA/cm^2$ or lower may be used. The constant current density may be at least about 0.5 $mA/cm^2$, or at least about 1 $mA/cm^2$ in various embodiments. Current densities at this level have been shown, when properly balanced against other plating conditions, to result in the desired superconformal fill mechanism.

In some other embodiments, the current density may be ramped up as the features are filled with metal. In one example, the current density may start at a value between about 0-4 $mA/cm^2$, for example between about 0-2 $mA/cm^2$, and ramp up to a value between about 6-10 $mA/cm^2$, for example between about 8-10 $mA/cm^2$. The disclosed mechanism relies, to some degree, on the metal species being less mass transport limited than the sacrificial oxidant, such that the sacrificial oxidant becomes depleted within the feature, but the metal remains readily available both in the field region and within the feature. The described mechanism is most effective at relatively low current densities which are sufficiently high to cause depletion of the sacrificial oxidant within the feature, while not being sufficiently high to cause similar depletion of the metal ion within the feature. However, at very low current densities, the seed layer on the field region can become damaged due to insufficient electrode polarization, causing dissolution of the seed layer. Additionally, at low current densities, small differences in overpotential across a part can cause large differences in plating rates due to how close the potential is to the deposition potential of the metal. This leads to poor uniformity in plating results. Better quality plating can be achieved by changing the applied current from a lower value to a higher value over the course of electroplating. The ramping current addresses the field region seed dissolution problem by only holding at very low current densities for a short time at the beginning of the fill, when the unfilled area of the feature is at a maximum. The ramping current addresses the uniformity problem by ensuring that all areas of the feature/substrate experience a similar potential increase (even if this occurs at differing times), thereby improving the final uniformity of the plated film. Current waveforms can be ramped up linearly, stepwise, or as a function mirroring the estimated decrease in the unplated volume within the feature.

Regardless of the current waveform used while the features are plated with metal, operation 705 may further involve application of current to the substrate to deposit overburden on the field region. The current density used during deposition of the overburden may be higher than the current density applied while the features are filled.

Operations 707-710 describe the superconformal fill mechanism. These operations occur during plating, e.g., during operation 705. In operation 707, the concentration of the sacrificial oxidant is depleted within the recessed features. This forms a concentration differential (in various embodiments a concentration gradient) with respect to the sacrificial oxidant, with the sacrificial oxidant being relatively more abundant in the field region and near the top of the feature, and relatively less abundant within the feature, particularly near the bottom of the feature. Example processing variables that should be properly balanced against one another to ensure development of the sacrificial oxidant concentration differential include the concentration of the sacrificial oxidant in bulk solution (e.g., where the sacrificial oxidant is H+, the pH of the electrolyte is important), the reduction potential of the sacrificial oxidant, the reduction potential experienced during electroplating, the substrate rotation rate (and/or other factors affecting mass transfer within the electrolyte), etc. In various embodiments, the substrate may be rotated at a rate between about 0-100 RPM, in some cases at least about 5 RPM, or at least about 10 RPM.

Operation 708 describes that during plating, there should not be a substantial concentration differential with respect to the metal ions in the field region and near the top of the feature, compared to within the feature, particularly near the feature bottom. In other words, deposition of the metal within the features should not be limited by mass transport of the metal ions. Otherwise, the metal could become depleted within the features, deleteriously affecting the desired superconformal fill mechanism. Example processing variables that should be properly balanced against one another to ensure that no substantial metal concentration differential forms include the concentration of metal ions in solution, the reduction potential of the metal ions, the reduction potential experienced during electroplating, the substrate rotation rate (and/or other factors affecting mass transfer within the electrolyte), etc.

Because it is desired to establish a concentration differential with respect to the sacrificial oxidant, but not with respect to the metal being plated, it is generally desirable to ensure that the metal ion is provided to the electrolyte at a higher concentration than the sacrificial oxidant. In some cases, the concentration of the sacrificial oxidant may be at least about 10 times higher than the concentration of the metal ion in the bulk electrolyte.

In operation 709, a current efficiency differential develops between the field region and within the substrate. In the field region, the current efficiency remains low due to the abundance of sacrificial oxidant molecules. As these sacrificial oxidant molecules are reduced, they divert the reduction current away from the metal reduction reaction, leading to a relatively lower rate of metal deposition in the field region and near the top of the feature. Within the feature, particularly near the feature bottom, the current efficiency is initially low due to the presence of the sacrificial oxidant molecules. However, due at least in part to the high surface area to volume ratio within the features (as well as the balance of all the various plating conditions), the current efficiency near the feature bottom quickly rises during plating as the sacrificial oxidant molecules are depleted in this region, leading to a relatively high rate of metal deposition near the feature bottom. As mentioned in operation 710, the differential current efficiency drives the superconformal fill mechanism, with metal deposition happening relatively faster near the bottom of the feature and relatively slower near the top of the feature and in the field region. The result is that the feature fills from the bottom upwards, as shown in FIG. 2, for example.

Figure 8:
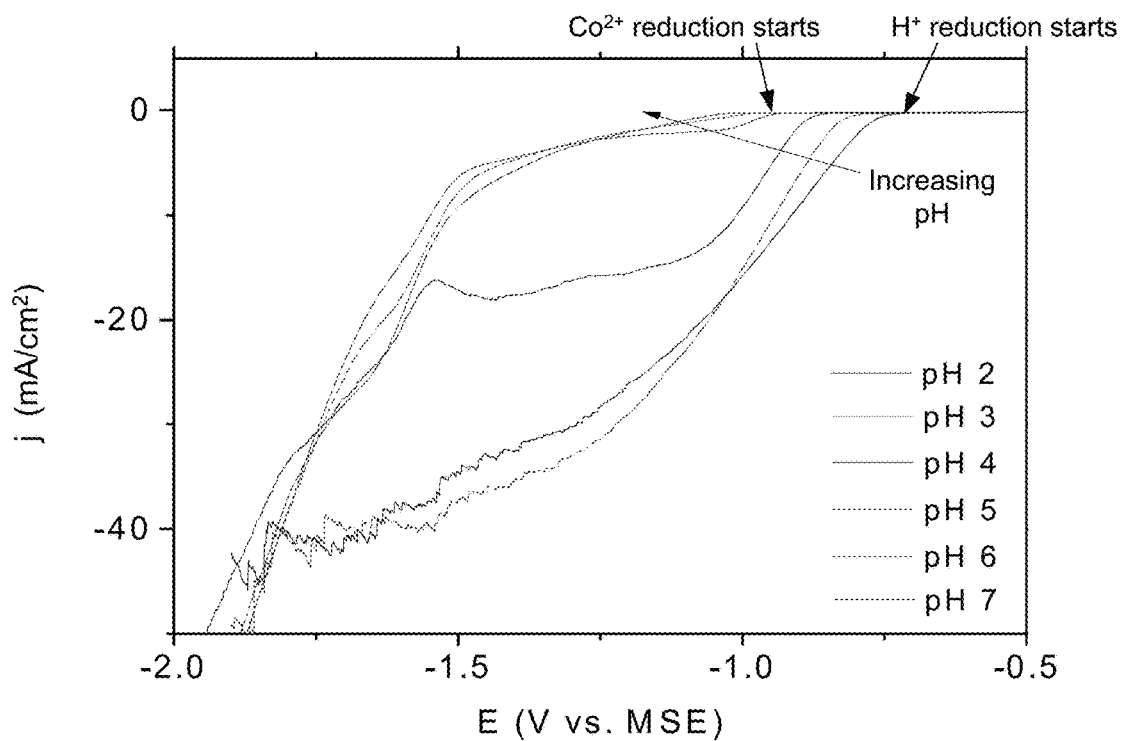
FIG. 8 illustrates the reductive wave of a cyclic voltammogram in an electrolyte having cobalt ions and hydrogen ions at various concentrations.

In a particular embodiment, the metal being deposited is cobalt, and the sacrificial oxidant is $H^+$. Experimental results have shown that when the various processing conditions are properly balanced against one another (e.g., as described in relation to FIGS. 4-6), hydrogen ions work well as sacrificial oxidant molecules in the context of superconformal cobalt fill. FIG. 8 describes the motivation behind selection of hydrogen ions as the sacrificial oxidant in various embodiments. Specifically, FIG. 8 shows a reductive wave of a cyclic voltammogram in electrolyte that includes $Co^{2+}$ and $H^+$ at various concentrations. In this system, $H^+$ is an acceptable sacrificial oxidant at least partly because the magnitude of the reduction potential for $H^+$ is lower than the magnitude of the reduction potential for $Co^{2+}$, at least for certain electrolyte pH values. The results are especially promising for solutions having a pH of about 2, 3, or 4. At pH values of about 5 or greater, the hydrogen ions are less abundant in the electrolyte, and the reduction potential for the hydrogen ions may be about equal to or greater than the reduction potential for the cobalt ions. As such, at these higher pH values, the superconformal fill mechanism is not likely to be successful.

In one example, an electrolyte for depositing cobalt may have the following properties:

TABLE 1

| Property | Value |
| --- | --- |
| Concentration of cobalt (II) salt/cobalt (II) ions | 0.005-1M |
| pH | 2-4 |

Example cobalt (II) salts include, but are not limited to, cobalt (II) sulfate heptahydrate, cobalt (II) chloride hexahydrate, cobalt (II) nitrate, and combinations thereof. The cobalt salt is the source of the cobalt ions. In various embodiments, the cobalt ion concentration may be between about 10-100 mM, or between about 30-70 mM.

Example acids include, but are not limited to, boric acid, sulfuric acid, hydrochloric acid, phosphoric acid, and combinations thereof. In some embodiments, boric acid may be provided at a concentration between about 0.01-1 M, for example between about 0.05-0.6 M. Boric acid has positive effects on cobalt nucleation (as well as nucleation of other metals such as nickel), and is commonly used in various electroplating applications. The electrolyte may have a pH between about 2-4, for example between about 3-4, with pH adjusted through the addition of sulfuric acid, hydrochloric acid, phosphoric acid, or a combination thereof. This may provide a hydrogen ion concentration between about 0.1-10 mM, for example between about 0.1-1 mM. In cases where the sacrificial oxidant is a species other than hydrogen ions, the concentration of the sacrificial oxidant may be between about 0.1-10 mM, for example between about 0.1-1 mM.

One example sacrificial oxidant is hydrogen ion, e.g., sourced from sulfuric acid, hydrochloric acid, phosphoric acid, or other strong acid. Other example sacrificial oxidants include hydrogen peroxide, nitric acid, and dissolved oxygen.

In some embodiments where the electrolyte is prepared according to Table 1, the electrolyte may be free or substantially free (e.g., containing only trace amounts) of suppressor, accelerator, and leveler. In some other embodiments where electrolyte is prepared according to Table 2, one or more of these additives may be provided.

TABLE 2

| Property | Value |
| --- | --- |
| Concentration of cobalt (II) salt/cobalt (II) ions | 0.005-1M |
| pH | 2-4 |
| Concentration of suppressor molecules | 0-30 g/L |
| Concentration of accelerator molecules | 0-30 g/L |
| Concentration of leveler molecules | 0-30 g/L |

In one example, referred to as Example 1, the cobalt ion concentration may be between about 10-100 mM, the boric acid concentration may be between about 0.05-0.6 mM, the pH of the electrolyte is between about 2-4 (e.g., an H+ concentration between about 0.1-10 mM), the substrate is rotated at a rate between about 0-100 RPM, a 0-30 second pre-conditioning step (e.g., as explained in relation to operation 703 in FIG. 7) is provided after immersion and before application of any current, and the substrate is plated at a constant current density at about 4 $mA/cm^2$ or below (in various embodiments the constant current density may be at least about 0.5 $mA/cm^2$ or at least about 1 $mA/cm^2$). The cobalt ion concentration may be at least about 10 times higher than the concentration of hydrogen ion.

In another example, referred to as Example 2, the cobalt ion concentration may be between about 10-100 mM, the boric acid concentration may be between about 0.05-0.6 mM, the pH of the electrolyte is between about 2-4 (e.g., an H+ concentration between about 0.1-10 mM), the substrate is rotated at a rate between about 0-100 RPM, a 0-30 second pre-conditioning step (e.g., as explained in relation to operation 703 in FIG. 7) is provided after immersion and before application of any current, and the substrate is plated with a ramping current waveform that starts at a low current (e.g., as low as 0 $mA/cm^2$) and ends at a higher current (e.g., as high as about 10 $mA/cm^2$). The cobalt ion concentration may be at least about 10 times higher than the concentration of hydrogen ion.

In another example, referred to as Example 3, the conditions are as described in relation to Example 1 or Example 2, except that the electrolyte also includes a suppressor to enhance the superconformal fill mechanism. The suppressor may be provided at a concentration listed above.

In another example, referred to as Example 4, the conditions are as described in relation to any of Examples 1-3, except that an alternative sacrificial oxidant is provided. The concentration of the alternative sacrificial oxidant may be determined based on the properties of the sacrificial oxidant (e.g., using the methods described in relation to FIGS. 4-6). Example alternative sacrificial oxidant molecules having soluble reduction products include H2O2 and other peroxides, dissolved $O_2$ and/or $O_3$, $HNO_3$, gluconic acid and other sugar acids, Fe(III), $Cl_2$, $Br_2$, and $I_2$.

In another example, referred to as Example 5, the electrolyte has a cobalt ion concentration of about 50 mM, a boric acid concentration of about 0.5 M, and a pH of about 3. The electrolyte also has a suppressor present, e.g., functionalized PEG, PPG, etc. The substrate may be rotated at a rate of about 50 RPM. After immersion and before application of current, a 1 second pre-conditioning step is applied where no current is provided to the substrate. Current may be applied in a ramping waveform, starting at about 0 mA/cm$^2$ and rising to about 8 mA/cm$^2$ over a period of about 60 seconds. The temperature of the electrolyte may be about 25° C. This combination of conditions has been shown to result in superconformal fill.

Figures 9A, 9B, 9C:
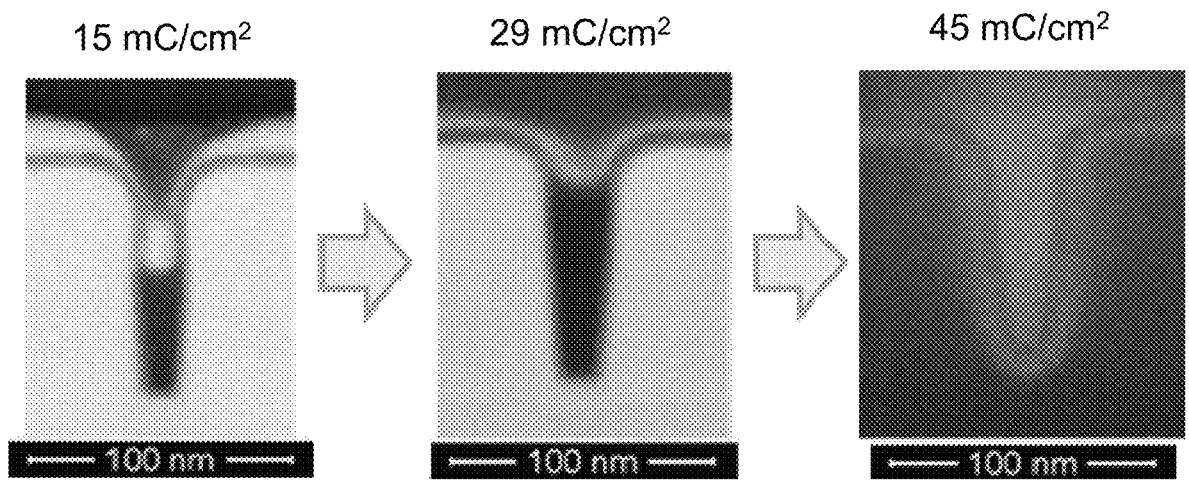
FIGS. 9A-9C depict a recessed feature after particular elapsed times as each feature is filled using the disclosed superconformal fill mechanism.

FIGS. 9A-9C depict experimental results showing a feature being filled using the disclosed superconformal fill mechanism. The same deposition conditions were used to fill each of the features shown in FIGS. 9A-9C, except for deposition time. The deposition in FIG. 9A was stopped after a short duration (after passing about 15 mC/cm$^2$ to the substrate), the deposition in FIG. 9B was stopped after a longer duration (after passing about 29 mC/cm$^2$ to the substrate), and the deposition in FIG. 9C was stopped after the longest duration (after passing about 45 mC/cm$^2$ to the substrate). Therefore, when taken together, FIGS. 9A-9C illustrate a recessed feature being filled over time using the superconformal fill mechanism. As shown in FIGS. 9A and 9B, the metal is deposited in a nearly flat profile, and the feature is filled from the bottom upwards. As shown in FIG. 9C, the resulting fill is very high quality, without any seams or voids. The deposition conditions used in relation to FIGS. 9A-9C are those described in Example 5, above.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 10:
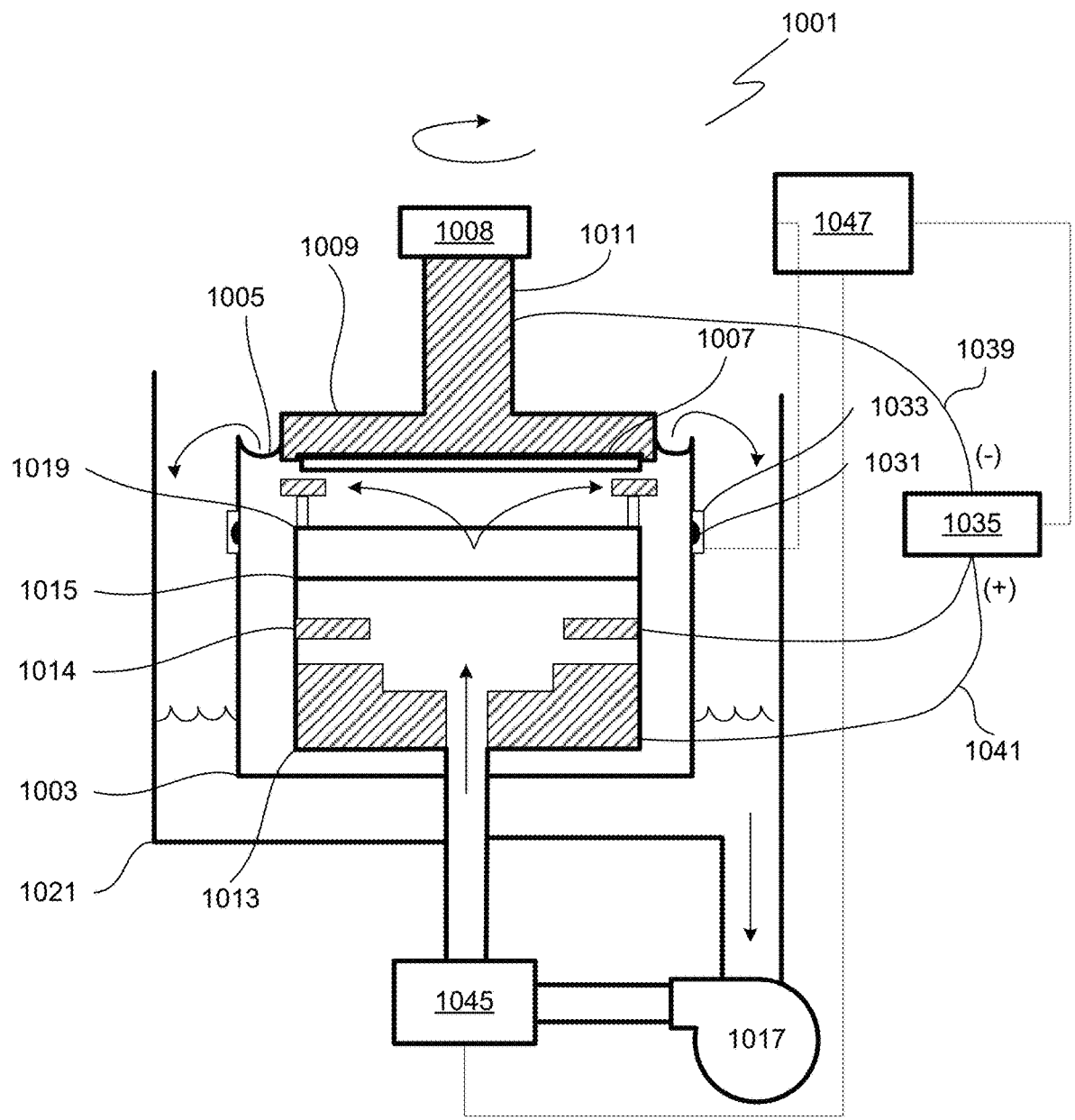
FIG. 10 shows a simplified view of an electroplating cell according to certain embodiments.

FIG. 10 presents an example of an electroplating cell in which electroplating may occur. Often, an electroplating apparatus includes one or more electroplating cells in which the substrates (e.g., wafers) are processed. Only one electroplating cell is shown in FIG. 10 to preserve clarity. To optimize bottom-up electroplating, additives (e.g., accelerators, suppressors, and levelers) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 10, a diagrammatical cross-sectional view of an electroplating apparatus 1001 in accordance with one embodiment is shown. The plating bath 1003 contains the plating solution (having a composition as provided herein), which is shown at a level 1005. The catholyte portion of this vessel is adapted for receiving substrates in a catholyte. A wafer 1007 is immersed into the plating solution and is held by, e.g., a "clamshell" substrate holder 1009, mounted on a rotatable spindle 1011, which allows rotation of clamshell substrate holder 1009 together with the wafer 1007. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties.

An anode 1013 is disposed below the wafer within the plating bath 1003 and is separated from the wafer region by a membrane 1015, preferably an ion selective membrane. For example, Nafion™ cationic exchange membrane (CEM) may be used. The region below the anodic membrane is often referred to as an "anode chamber." The ion-selective anode membrane 1015 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole or other feature. A typical way to assist the diffusion is through convection flow of the electroplating solution provided by the pump 1017. Additionally, a vibration agitation or sonic agitation member may be used as well as wafer rotation. For example, a vibration transducer 1008 may be attached to the clamshell substrate holder 1009.

The plating solution is continuously provided to plating bath 1003 by the pump 1017. Generally, the plating solution flows upwards through an anode membrane 1015 and a diffuser plate 1019 to the center of wafer 1007 and then radially outward and across wafer 1007. The plating solution also may be provided into the anodic region of the bath from the side of the plating bath 1003. The plating solution then overflows plating bath 1003 to an overflow reservoir 1021. The plating solution is then filtered (not shown) and returned to pump 1017 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 1031 is located on the outside of the plating bath 1003 in a separate chamber 1033, which chamber is replenished by overflow from the main plating bath 1003. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 1031 is typically employed when electroplating at a controlled potential is desired. The reference electrode 1031 may be one of a variety of commonly used types such as mercury/mercury sulfate, silver chloride, saturated calomel, or copper metal. A contact sense lead in direct contact with the wafer 1007 may be used in some embodiments, in addition to the reference electrode, for more accurate potential measurement (not shown).

A DC power supply 1035 can be used to control current flow to the wafer 1007. The power supply 1035 has a negative output lead 1039 electrically connected to wafer 1007 through one or more slip rings, brushes and contacts (not shown). The positive output lead 1041 of power supply 1035 is electrically connected to an anode 1013 located in plating bath 1003. The power supply 1035, a reference electrode 1031, and a contact sense lead (not shown) can be connected to a system controller 1047, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 1035 biases the wafer 1007 to have a negative potential relative to anode 1013. This causes an electrical current to flow from anode 1013 to the wafer 1007, and an electrochemical reduction (e.g. $Cu^{2+}+2\ e^-=Cu^0$) occurs on the wafer surface (the cathode), which results in the deposition of the electrically conductive layer (e.g. copper) on the surfaces of the wafer. An inert anode 1014 may be installed below the wafer 1007 within the plating bath 1003 and separated from the wafer region by the membrane 1015.

The apparatus may also include a heater 1045 for maintaining the temperature of the plating solution at a specific level. The plating solution may be used to transfer the heat to the other elements of the plating bath. For example, when a wafer 1007 is loaded into the plating bath the heater 1045 and the pump 1017 may be turned on to circulate the plating solution through the electroplating apparatus 1001, until the temperature throughout the apparatus becomes substantially uniform. In one embodiment the heater is connected to the system controller 1047. The system controller 1047 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 1047. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 11:
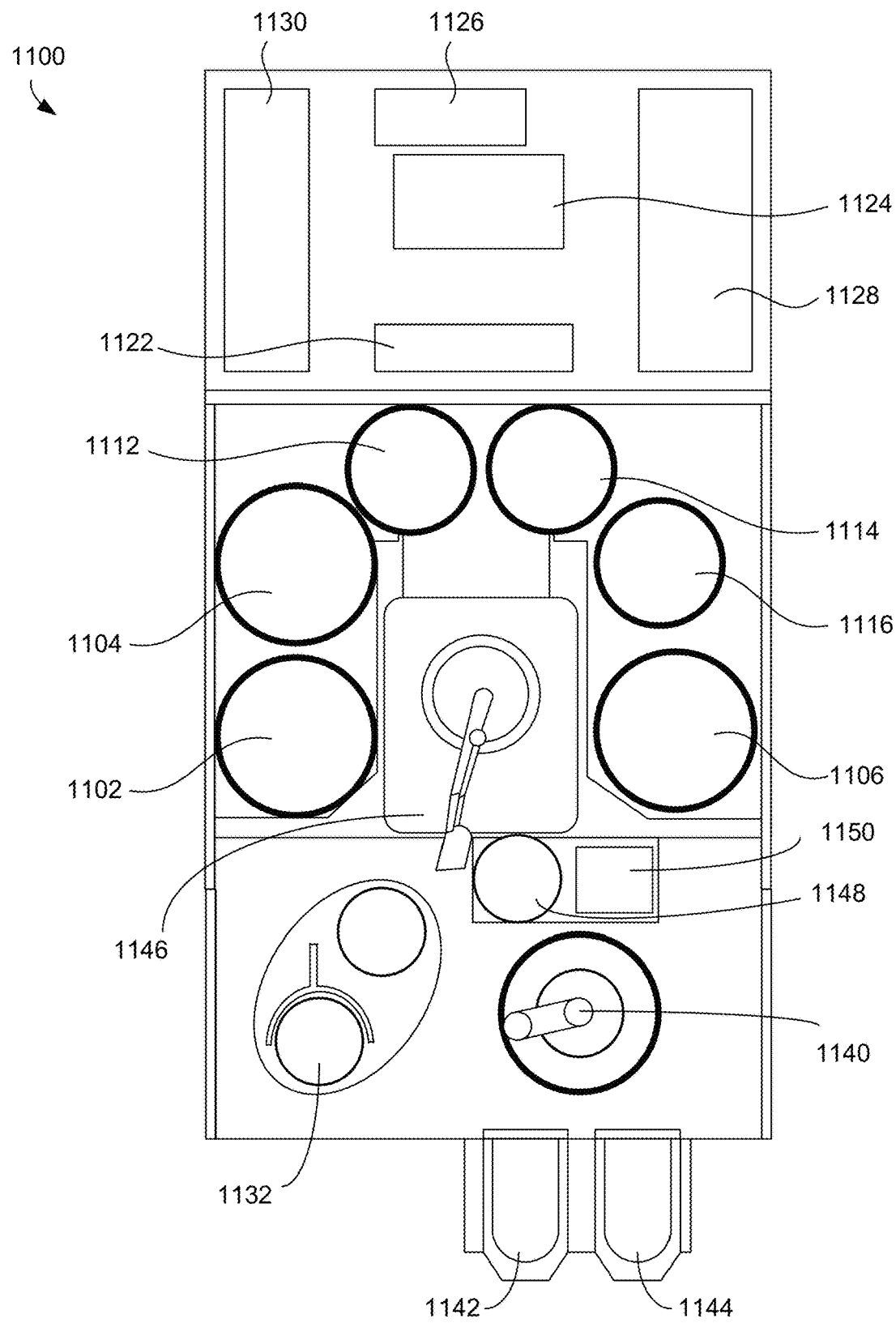
FIGS. 11 and 12 show simplified views of a multi-station electroplating apparatus according to certain embodiments.

FIG. 11 shows a schematic of a top view of an example electrodeposition apparatus. The electrodeposition apparatus 1100 can include three separate electroplating modules 1102, 1104, and 1106. The electrodeposition apparatus 1100 can also include three separate modules 1112, 1114, and 1116 configured for various process operations. For example, in some embodiments, one or more of modules 1112, 1114, and 1116 may be a spin rinse drying (SRD) module. In other embodiments, one or more of the modules 1112, 1114, and 1116 may be post-electrofill modules (PEMs), each configured to perform a function, such as edge bevel removal, backside etching, and acid cleaning of substrates after they have been processed by one of the electroplating modules 1102, 1104, and 1106.

The electrodeposition apparatus 1100 includes a central electrodeposition chamber 1124. The central electrodeposition chamber 1124 is a chamber that holds the chemical solution used as the electroplating solution in the electroplating modules 1102, 1104, and 1106. The electrodeposition apparatus 1100 also includes a dosing system 1126 that may store and deliver additives for the electroplating solution. A chemical dilution module 1122 may store and mix chemicals to be used as an etchant. A filtration and pumping unit 1128 may filter the electroplating solution for the central electrodeposition chamber 1124 and pump it to the electroplating modules.

A system controller 1130 provides electronic and interface controls required to operate the electrodeposition apparatus 1100. The system controller 1130 (which may include one or more physical or logical controllers) controls some or all of the properties of the electroplating apparatus 1100.

Signals for monitoring the process may be provided by analog and/or digital input connections of the system controller 1130 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 1140 may select a substrate from a substrate cassette such as the cassette 1142 or the cassette 1144. The cassettes 1142 or 1144 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1140 may hold the substrate using a vacuum attachment or some other attaching mechanism.

The hand-off tool 1140 may interface with a wafer handling station 1132, the cassettes 1142 or 1144, a transfer station 1150, or an aligner 1148. From the transfer station 1150, a hand-off tool 1146 may gain access to the substrate. The transfer station 1150 may be a slot or a position from and to which hand-off tools 1140 and 1146 may pass substrates without going through the aligner 1148. In some embodiments, however, to ensure that a substrate is properly aligned on the hand-off tool 1146 for precision delivery to an electroplating module, the hand-off tool 1146 may align the substrate with an aligner 1148. The hand-off tool 1146 may also deliver a substrate to one of the electroplating modules 1102, 1104, or 1106 or to one of the three separate modules 1112, 1114, and 1116 configured for various process operations.

An example of a process operation according to the methods described above may proceed as follows: (1) electrodeposit copper or another material onto a substrate in the electroplating module 1104; (2) rinse and dry the substrate in SRD in module 1112; and, (3) perform edge bevel removal in module 1114.

An apparatus configured to allow efficient cycling of substrates through sequential plating, rinsing, drying, and PEM process operations may be useful for implementations for use in a manufacturing environment. To accomplish this, the module 1112 can be configured as a spin rinse dryer and an edge bevel removal chamber. With such a module 1112, the substrate would only need to be transported between the electroplating module 1104 and the module 1112 for the copper plating and EBR operations. In some embodiments the methods described herein will be implemented in a system which comprises an electroplating apparatus and a stepper.

Figure 12:
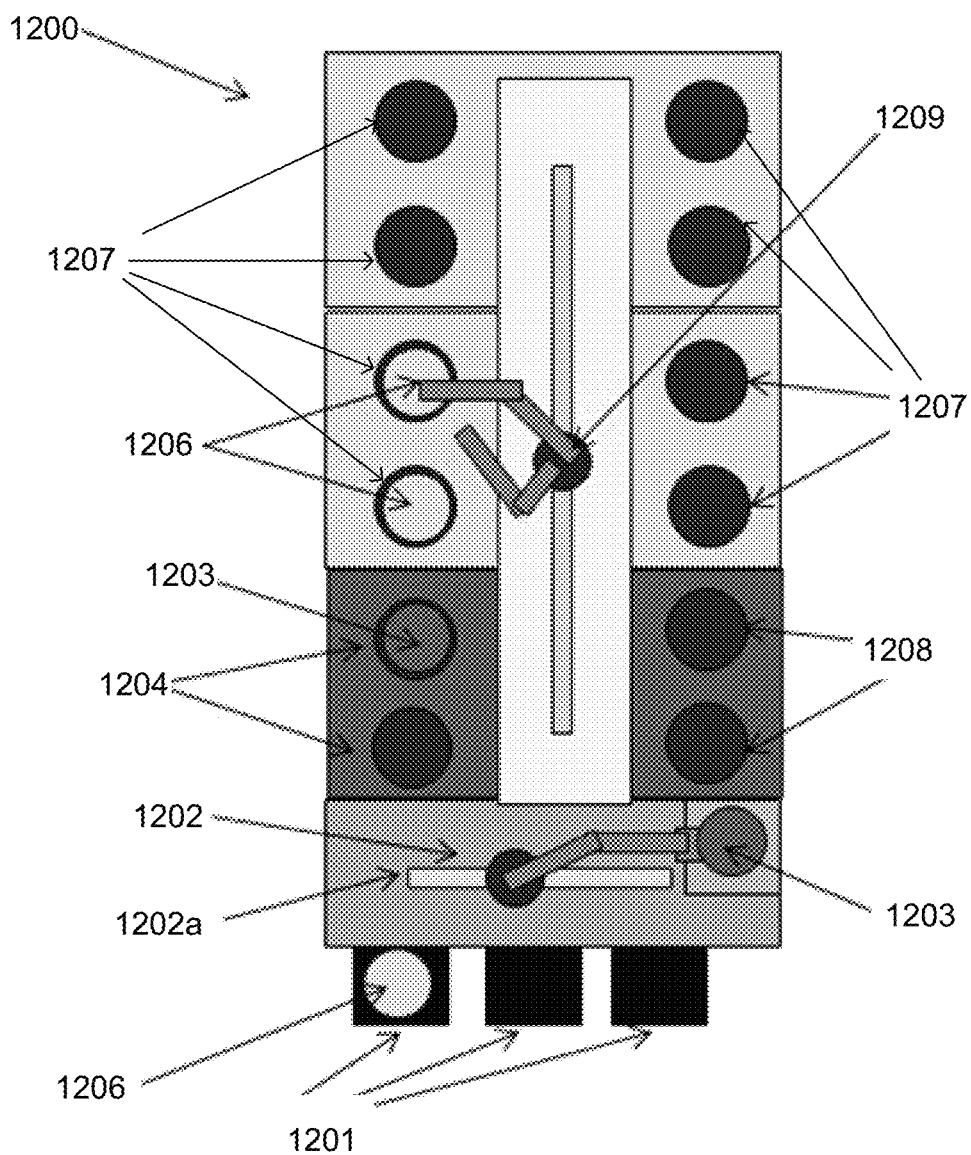

An alternative embodiment of an electrodeposition apparatus 1200 is schematically illustrated in FIG. 12. In this embodiment, the electrodeposition apparatus 1200 has a set of electroplating cells 1207, each containing an electroplating bath, in a paired or multiple "duet" configuration. In addition to electroplating per se, the electrodeposition apparatus 1200 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1200 is shown schematically looking top down in FIG. 12, and only a single level or "floor" is revealed in the figure, but it is to be readily understood by one having ordinary skill in the art that such an apparatus, e.g., the Novellus Sabre™ 3 D tool, can have two or more levels "stacked" on top of each other, each potentially having identical or different types of processing stations.

Referring once again to FIG. 12, the substrates 1206 that are to be electroplated are generally fed to the electrodeposition apparatus 1200 through a front end loading FOUP 1201 and, in this example, are brought from the FOUP to the main substrate processing area of the electrodeposition apparatus 1200 via a front-end robot 1202 that can retract and move a substrate 1206 driven by a spindle 1203 in multiple dimensions from one station to another of the accessible stations—two front-end accessible stations 1204 and also two front-end accessible stations 1208 are shown in this example. The front-end accessible stations 1204 and 1208 may include, for example, pre-treatment stations, and spin rinse drying (SRD) stations. Lateral movement from side-to-side of the front-end robot 1202 is accomplished utilizing robot track 1202a. Each of the substrates 1206 may be held by a cup/cone assembly (not shown) driven by a spindle 1203 connected to a motor (not shown), and the motor may be attached to a mounting bracket 1209. Also shown in this example are the four "duets" of electroplating cells 1207, for a total of eight electroplating cells 1207. A system controller (not shown) may be coupled to the electrodeposition apparatus 1200 to control some or all of the properties of the electrodeposition apparatus 1200. The system controller may be programmed or otherwise configured to execute instructions according to processes described earlier herein.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of electroplating a recessed feature on a substrate using a superconformal fill mechanism, the method comprising:
   (a) immersing the substrate in electrolyte, the electrolyte comprising metal ions and a sacrificial oxidant;
   (b) applying current to the substrate to plate metal in the recessed feature;
   (c) during (b), depleting a concentration of the sacrificial oxidant within the recessed feature to form a concentration differential with respect to the sacrificial oxidant, wherein the sacrificial oxidant becomes relatively less abundant within the recessed feature and relatively more abundant in a field region of the substrate;
   (d) during (b), developing a current efficiency differential, wherein the current efficiency is relatively higher within the recessed feature and relatively lower in the field region of the substrate; and
   (e) during (b), using the current efficiency differential to drive the superconformal fill mechanism that deposits metal relatively faster near a bottom of the recessed feature and relatively slower in the field region of the substrate.

2. The method of claim 1, wherein during (b), the metal ions are not mass transport limited, such that no substantial concentration differential forms with respect to the metal ions.

3. The method of claim 1, wherein the metal ions are cobalt ions and the sacrificial oxidant is hydrogen ions.

4. The method of claim 3, wherein the electrolyte comprises about 10-100 mM cobalt ions, about 0.05-0.6 M boric acid, a pH between about 2-4, and wherein a concentration of cobalt ions in the electrolyte is at least about 10 times higher than a concentration of hydrogen ions in the electrolyte.

5. The method of claim 4, wherein during (b) the substrate is rotated at a rate between about 1-100 RPM, and wherein during (b) current is applied to the substrate at a constant current density of about 4 mA/cm$^2$ or below.

6. The method of claim 5, further comprising after (a) and before (b), performing a pre-conditioning step where no current or potential is applied to the substrate for a duration between about 0.25-30 seconds.

7. The method of claim 1, wherein the sacrificial oxidant, or a material that acts as a source for the sacrificial oxidant, is selected from the group consisting of: a peroxide, dissolved $O_2$, dissolved $O_3$, $HNO_3$, a sugar acid, $Cl_2$, $Br_2$, and $I_2$, and combinations thereof.

8. The method of claim 1, wherein the electrolyte is substantially free of suppressor, accelerator, and leveler.

9. The method of claim 1, wherein the electrolyte further comprises suppressor.

10. The method of claim 1, wherein during (b) a current density applied to the substrate increases from a starting current density to an ending current density, the starting current density being between about 0-4 mA/cm$^2$ and the ending current density being between about 6-10 mA/cm$^2$.

11. An apparatus for electroplating metal into a recessed feature using a superconformal fill mechanism, the apparatus comprising:
   an electroplating chamber configured to hold electrolyte;
   a substrate holder configured to immerse the substrate in the electrolyte; and
   a controller comprising executable instructions for:
      (a) immersing the substrate in electrolyte, the electrolyte comprising metal ions and a sacrificial oxidant;
      (b) applying current to the substrate to plate metal in the recessed feature;
      (c) during (b), depleting a concentration of the sacrificial oxidant within the recessed feature to form a concentration differential with respect to the sacrificial oxidant, wherein the sacrificial oxidant becomes relatively less abundant within the recessed feature and relatively more abundant in a field region of the substrate;

(d) during (b), developing a current efficiency differential, wherein the current efficiency is relatively higher within the recessed feature and relatively lower in the field region of the substrate; and
(e) during (b), using the current efficiency differential to drive the superconformal fill mechanism that deposits metal relatively faster near a bottom of the recessed feature and relatively slower in the field region of the substrate.

* * * * *